United States Patent
Inaba

(10) Patent No.: US 8,154,905 B2
(45) Date of Patent: Apr. 10, 2012

(54) SEMICONDUCTOR MEMORY DEVICE HAVING A RESISTIVE MEMORY ELEMENT

(75) Inventor: Tsuneo Inaba, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 286 days.

(21) Appl. No.: 12/491,544

(22) Filed: Jun. 25, 2009

(65) Prior Publication Data

US 2009/0323396 A1   Dec. 31, 2009

(30) Foreign Application Priority Data

Jun. 25, 2008 (JP) ................................. 2008-166158

(51) Int. Cl.
*G11C 11/00* (2006.01)

(52) U.S. Cl. ............... 365/148; 365/46; 365/55; 365/74; 365/97; 365/100; 365/131; 365/158; 365/171; 365/173; 365/163; 365/189.011

(58) Field of Classification Search ..................... 365/46, 365/55, 74, 97, 100, 131, 148, 158, 171, 365/173, 163, 189.011
See application file for complete search history.

(56) References Cited

U.S. PATENT DOCUMENTS

| | | | |
|---|---|---|---|
| 5,695,864 A | 12/1997 | Slonczewski | |
| 6,882,565 B2 | 4/2005 | Tsuchida | |
| 6,999,340 B2 | 2/2006 | Shimizu | |
| 7,106,618 B2 | 9/2006 | Morimoto | |
| 7,116,593 B2 | 10/2006 | Hanzawa et al. | |
| 2004/0184331 A1* | 9/2004 | Hanzawa et al. | 365/203 |
| 2005/0047205 A1* | 3/2005 | Tsuchida | 365/171 |
| 2005/0185445 A1* | 8/2005 | Osada et al. | 365/148 |

OTHER PUBLICATIONS

Hosomi, M. et al., "A Novel Nonvolatile Memory with Spin Torque Transfer Magnetization Switching: Spin-RAM", Dec. 2005, pp. 459-462, IEDM Digest of Technical Papers 2005.
Iwata, Y. et al., "A 16Mb MRAM with FORK Wiring Scheme and Burst Modes", Feb. 6, 2006, pp. 477-478, ISSCC Digest of Technical Papers 2006.
Explanation of Background Art Information.

* cited by examiner

*Primary Examiner* — Hoai V Ho
(74) *Attorney, Agent, or Firm* — Knobbe, Martens Olson & Bear LLP

(57) ABSTRACT

A semiconductor memory according to an aspect of the invention including first and second bit lines, a word line, a resistive memory element which has one end and the other end, the one end being connected with the first bit line, a selective switch element which has a current path and a control terminal, one end of the current path being connected with the other end of the resistive memory element, the other end of the current path being connected with the second bit line, the control terminal being connected with the word line, a first column switch connected with the first bit line, a second column switch connected with the second bit line, wherein the first and second bit lines is activated and then the word line is activated when starting writing or reading data with respect to the resistive memory element.

20 Claims, 15 Drawing Sheets

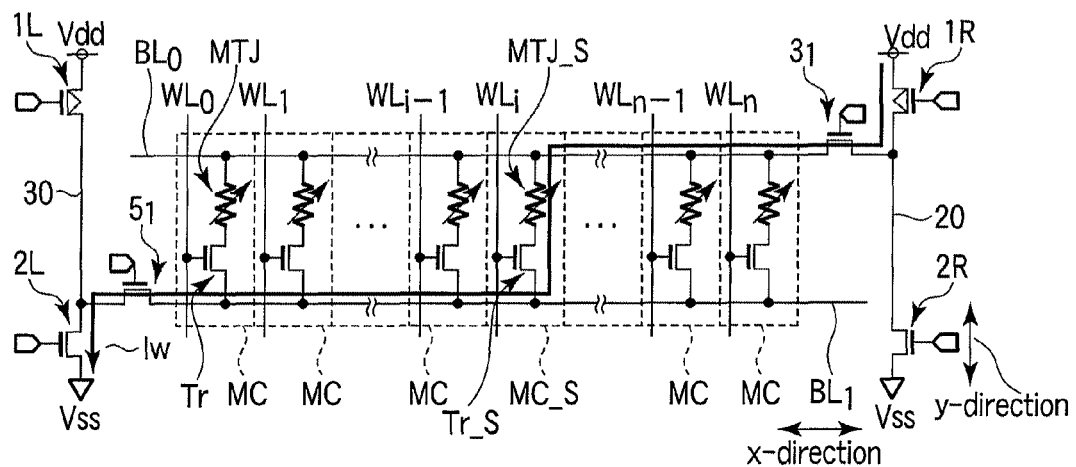
F I G. 1
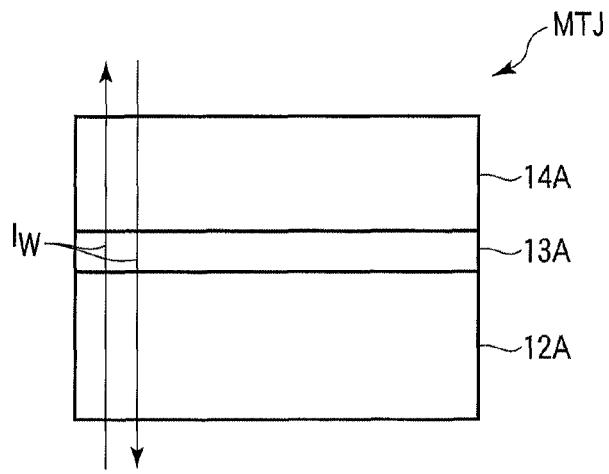
F I G. 2

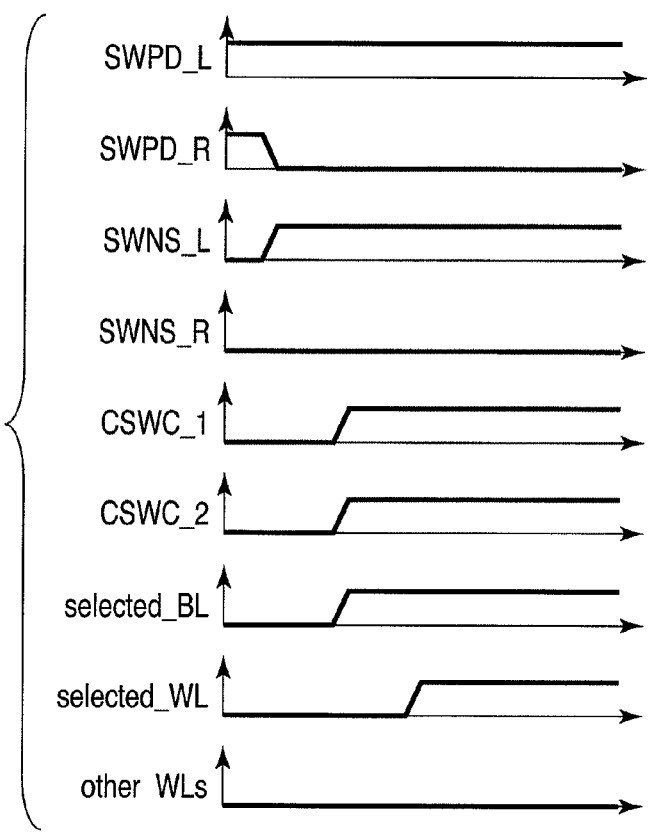
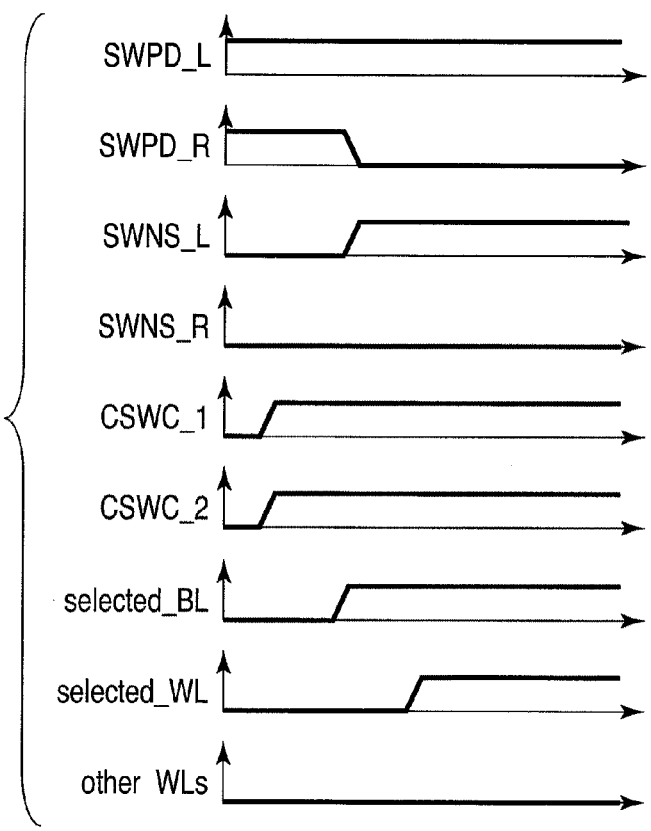

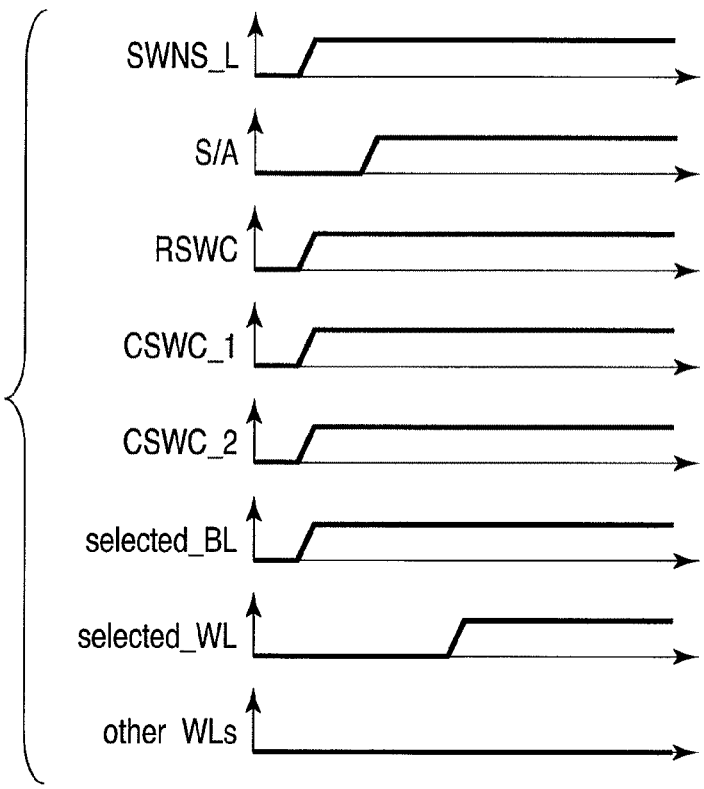
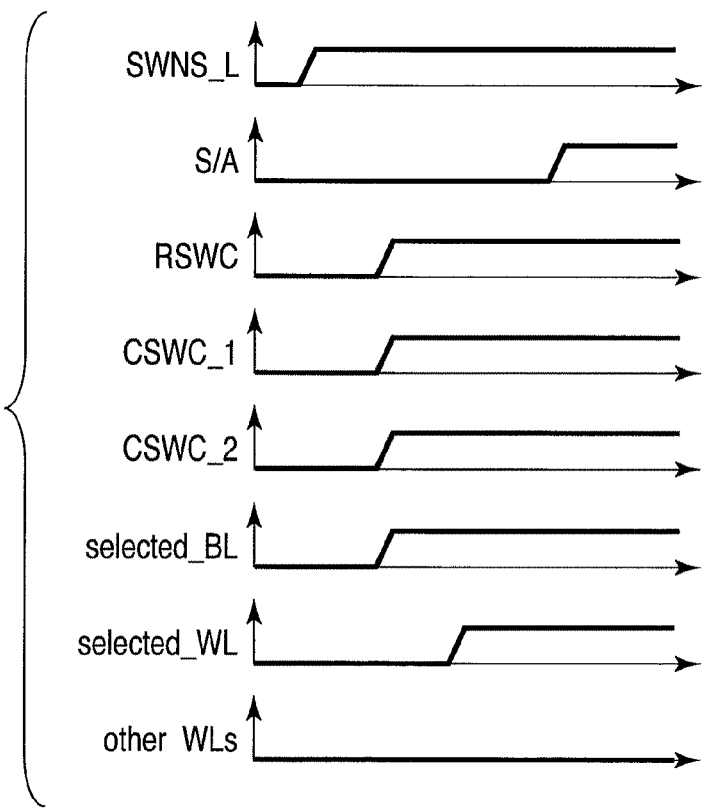

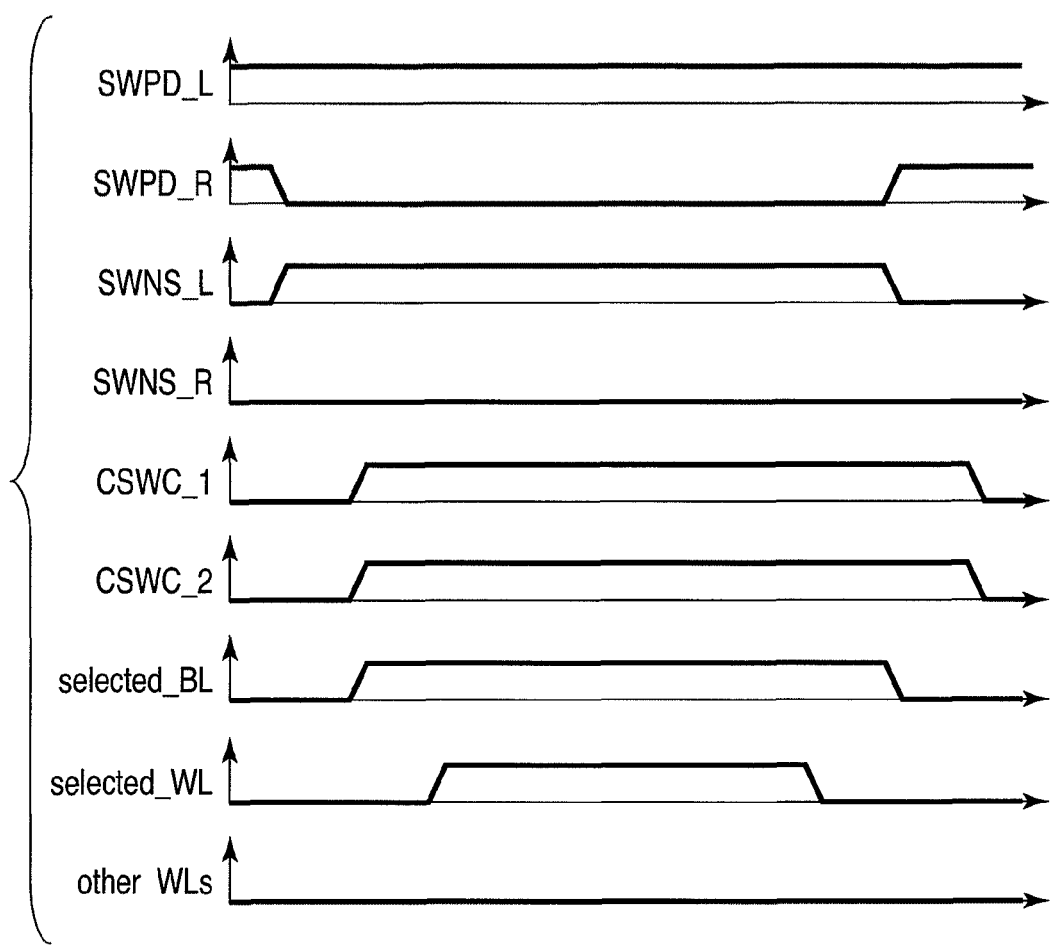
F I G. 10

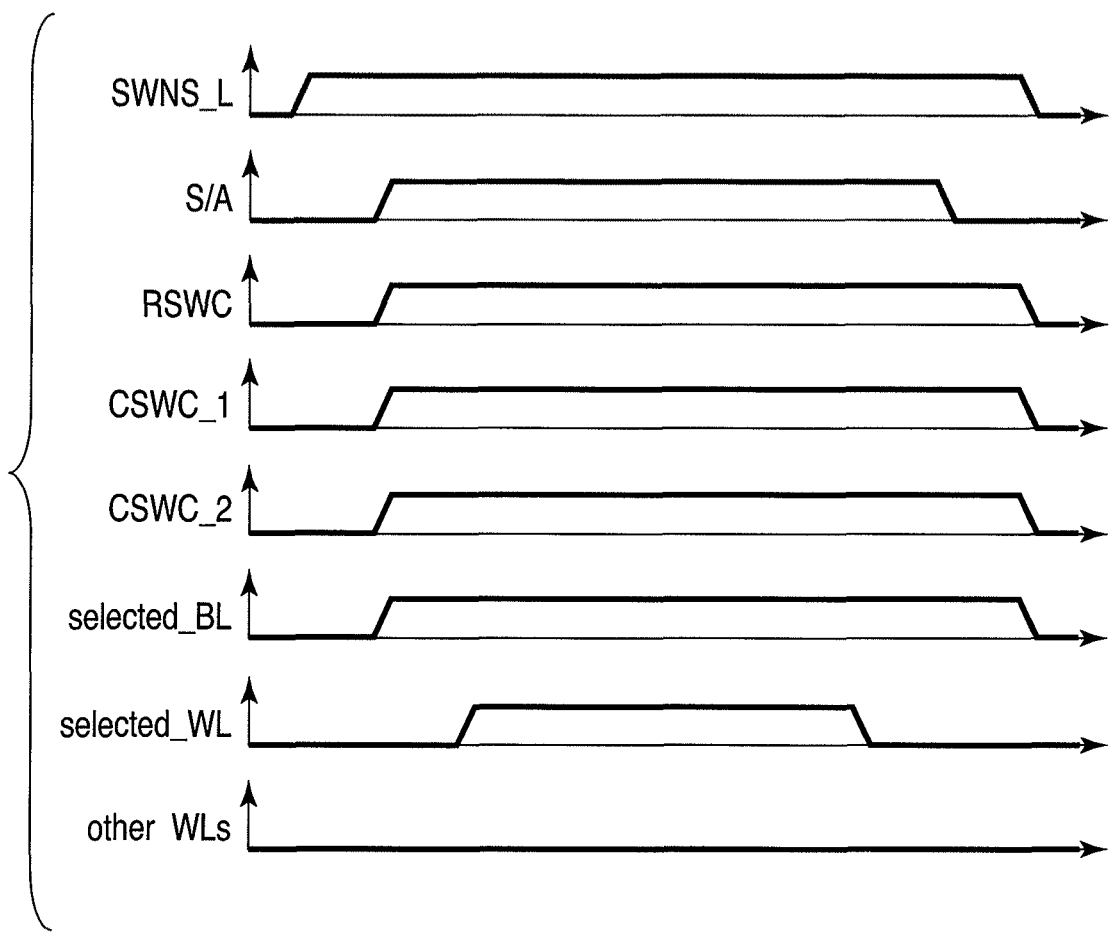
F I G. 12

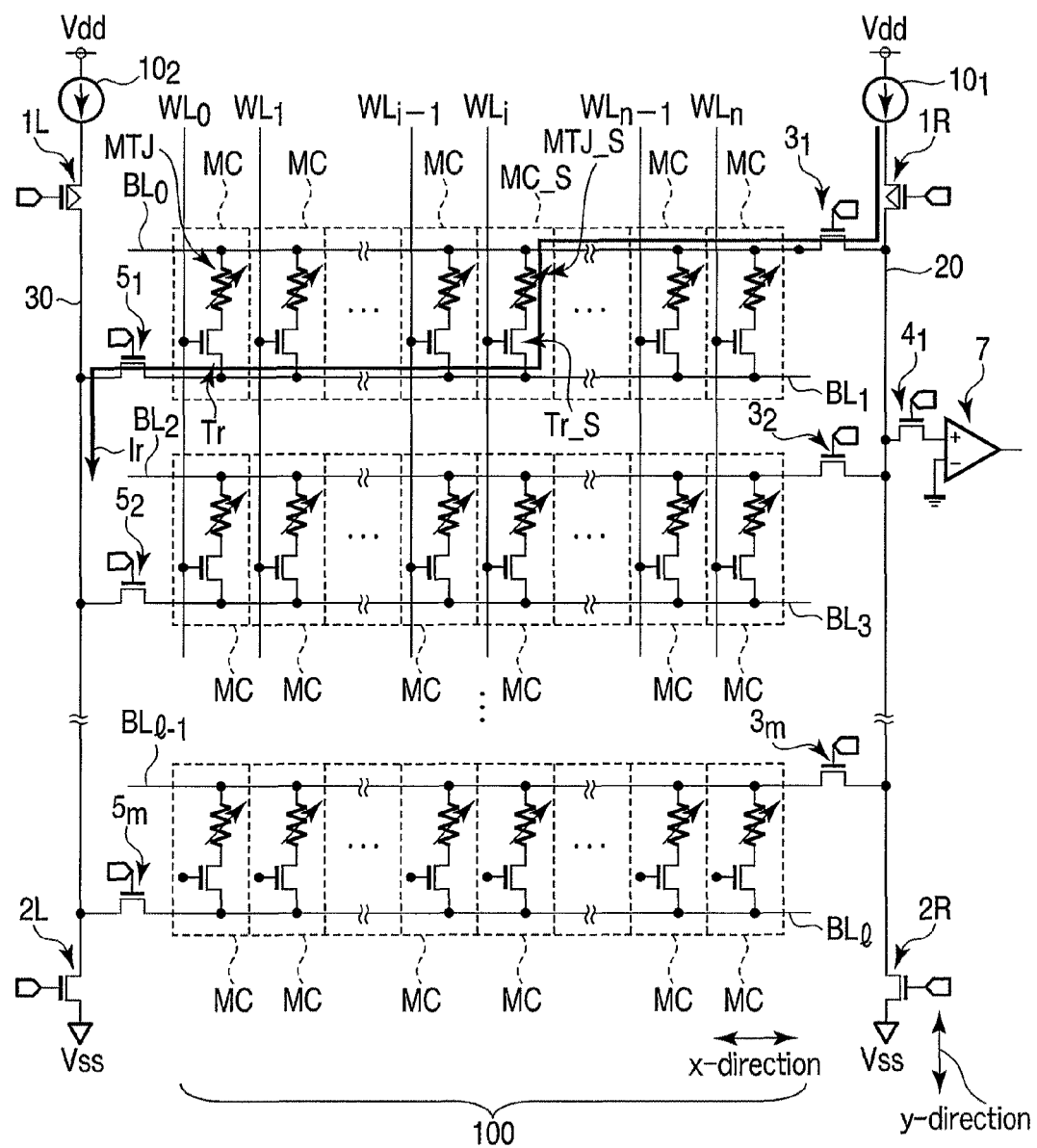
F I G. 15

SEMICONDUCTOR MEMORY DEVICE HAVING A RESISTIVE MEMORY ELEMENT

CROSS-REFERENCE TO RELATED APPLICATIONS

This application is based upon and claims the benefit of priority from prior Japanese Patent Application No. 2008-166158, filed Jun. 25, 2008, the entire contents of which are incorporated herein by reference.

BACKGROUND OF THE INVENTION

1. Field of the Invention

The present invention relates to a semiconductor memory device using a resistive memory element.

2. Description of the Related Art

In recent years, a semiconductor memory utilizing a resistive memory element as a memory element, e.g., an MRAM (Magnetoresistive Random Access Memory), a PCRAM (Phase Change Random Access Memory), or a ReRAM (Resistive Random Access Memory) has attracted much attention.

For example, in an MRAM, a magnetoresistive effect element called an MTJ (Magnetic Tunnel Junction) element is used for a memory element. A magnetoresistive effect element has a structure where an insulating film is sandwiched between two ferromagnetic bodies. A magnetizing direction of one ferromagnetic layer (a magnetization invariable layer) is fixed by an antiferromagnetic layer, and a magnetizing direction of the other ferromagnetic layer (a magnetization free layer) can be freely reversed. Further, a magnetoresistive effect in which a resistance value changes in accordance with a relative magnetizing direction of the magnetization invariable layer and the magnetization free layer in the magnetoresistive effect element is utilized to discriminate data "1" or data "0".

In recent years, a spin-transfer type MRAM utilizing magnetization reversal based on polarized spin current injection for a write mode has been advanced (see, e.g., U.S. Patent Publication No. 5695864 and 2005 IEDM Technical Digest, pp. 459-462, December 2005). In the spin-transfer scheme, since a current amount required for magnetization reversal (a reversal threshold current) is specified by a current density flowing through a magnetoresistive effect element, reducing an area of the magnetoresistive effect element leads to a decrease in the reverse threshold current. That is, the spin-transfer type MRAM is expected as a technology that can realize a high-capacity semiconductor memory since a reversal threshold current can be scaled. A write operation of the spin-transfer type MRAM is carried out by flowing a write current that is equal to or above a reversal threshold current through the magnetoresistive effect element. A polarity ("0" or "1") of data is rewritten based on a flowing direction of the write current with respect to the magnetoresistive effect element.

A memory cell used for the MRAM has, e.g., an 1Tr+1MTJ type structure. In this memory cell, one end of a magnetoresistive effect element is connected with a first bit line, the other end of the magnetoresistive effect element is connected with one source/drain of a select transistor, and the other source/drain of the select transistor is connected with a second bit line. Furthermore, a gate of the select transistor is connected with a word line, and many memory cells are connected with one pair of bit lines and a word line, thereby constituting a memory cell array of the MRAM.

An operating speed of the MRAM will now be explained. A switching speed of the magnetoresistive effect element is equal to a magnetization reversal speed of a magnetic body and is very high. For example, in case of a write operation, since a switching speed is dependent on an injection current density in switching of the magnetoresistive effect element based on the spin-transfer scheme, a high-speed operation of approximately 10 ns or less can be usually realized.

However, considering an entire write time including charge/discharge of a write interconnect line (a bit line), since many memory cells are connected with a pair of bit lines, a junction capacitance or the like of a diffusion layer of the select transistor is added to a parasitic capacitance of the interconnect lines.

As a result, an RC time constant of the interconnect lines is in proportion to not only a interconnect length but also the number of memory cells connected with pairs of bit lines. Therefore, the overall write speed in the pair of bit lines cannot be increased beyond a time including an RC product of a write interconnect line.

Therefore, when trying to realize a high-speed write operation, a interconnect length of the write interconnect line must be reduced. However, this means a reduction in scale of the memory cell array, thereby resulting in an increase in chip size and in manufacturing cost.

BRIEF SUMMARY OF THE INVENTION

A semiconductor memory according to an aspect of the invention including: first and second bit lines forming a pair of bit lines; a word line extending in a direction crossing a direction of extension of the first and second bit lines; a resistive memory element which has one end and the other end, the one end being connected with the first bit line; a selective switch element which has a current path and a control terminal, one end of the current path being connected with the other end of the resistive memory element, the other end of the current path being connected with the second bit line, the control terminal being connected with the word line; a first column switch connected with the first bit line; a second column switch connected with the second bit line; a first common line connected with the first bit line through the first column switch; and a second common line connected with the second bit line through the second column switch, wherein at least one of the first and second bit lines is activated and then the word line is activated when starting writing or reading data with respect to the resistive memory element.

A semiconductor memory according to an aspect of the invention including: a plurality of pairs of bit lines each having one bit line and the other bit line; a plurality of word lines extending in a direction crossing a direction of extension of the bit lines; a plurality of resistive memory elements each having one end and the other end, the one end being connected with the one bit line in each pair; a plurality of selective switch elements each having a first current path and a first control terminal, one end of the first current path being connected with one of the other ends of the resistive memory elements, the other end of the first current path being connected with the other bit line in each pair, the first control terminal being connected with one of the word lines; a plurality of first column switches each of which is connected with one end of the one bit line in each pair; a plurality of second column switches each of which is connected with one end of the other bit line in each pair; a first common line connected with the one bit line in each of the plurality of pairs in common through each of the plurality of first column switches; and a second common line connected with the other bit line in each of the plurality of pairs in common through each of the plurality of second column switches, wherein at least one of the one and the other bit lines constituting a selected bit line pair in the plurality of bit line pairs is activated and then a selected word line in the plurality of word lines is activated when starting writing or reading data with respect to a selected resistive memory element in the plurality of resistive memory elements.

BRIEF DESCRIPTION OF THE SEVERAL VIEWS OF THE DRAWING

FIG. 1 is an equivalent circuit diagram showing a basic structure of a semiconductor memory according to an embodiment of the present invention;

FIG. 2 is a view showing an example of a cross-sectional structure of a magnetoresistive effect element;

FIG. 3 is a waveform chart for explaining an operation of a semiconductor memory according to an embodiment of the present invention;

FIG. 4 is a view showing a modification of the operation depicted in FIG. 3;

FIG. 7 is a view showing a modification of the operation depicted in FIG. 6;

FIG. 8 is a view showing a modification of the operation depicted in FIG. 6;

FIG. 10 is a view showing a modification of the operation of the semiconductor memory depicted in FIG. 9;

FIG. 12 is a view showing a modification of an operation of a semiconductor memory depicted in FIG. 11;

FIG. 15 is an equivalent circuit diagram showing a circuit example of an MRAM according to the embodiment;

DETAILED DESCRIPTION OF THE INVENTION

Figure 5:
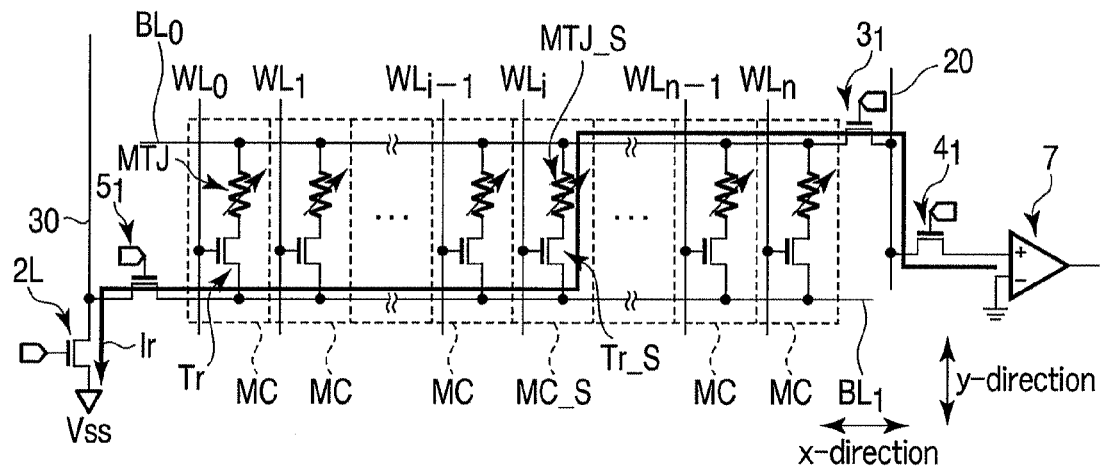
FIG. 5 is an equivalent circuit diagram showing a basic structure of a semiconductor memory according to an embodiment of the present invention.

Hereinafter, several embodiments for carrying out the examples of the present invention will be described in detail with reference to the drawings.

1. Outline

An embodiment according to the present invention relates to a semiconductor memory having a resistive memory element, e.g., a magnetoresistive random access memory (MRAM).

A semiconductor memory according to this embodiment includes one pair of bit lines, a word line, and a memory cell. The memory cell includes a resistive memory element and a selective switch element. The resistive memory element and the selective switch element are connected in series.

In this memory cell, one end of the resistive memory element is connected with one bit line, and one end of a current path of the selective switch element is connected with the other bit line. The word line is connected with a control terminal of the selective switch element.

The semiconductor memory according to this embodiment is characterized in that the bit lines are activated and then the word line is activated when starting a write operation or read operation for data with respect to the memory cell.

Driving the bit lines and the word line in this manner enables previously charging a contact point (a node) of each bit line and the memory cell before injecting a write current or a read current at the time of the write operation or the read operation. That is, in the MRAM according to this embodiment, the node can be charged in a state where a current does not flow through the memory cell selected for writing or reading.

Therefore, according to the MRAM of the embodiment of the present invention, speeds of the write operation and the read operation of the semiconductor memory can be increased.

2. Embodiments

The semiconductor memory according to an embodiment of the present invention will now be explained hereinafter with reference to FIGS. 1 to 21 while taking a spin-transfer type MRAM as an example.

[1] BASIC EXAMPLE

A basic example of a magnetoresistive random access memory (an MRAM) according to an embodiment of the present invention will now be explained hereinafter with reference to FIGS. 1 to 12.

(1) Write Operation

A basic structure of a circuit and an operation in a write operation in the MRAM according to an embodiment of the present invention will now be explained with reference to FIGS. 1 to 3.

FIG. 1 shows a primary part of a circuit configuration of an MRAM when executing a write operation in the MRAM according to the embodiment of the present invention.

In a memory cell array 100 of the MRAM according to this embodiment, a plurality of (e.g., 1024) memory cells MC and MC_S are provided.

Each memory cell MC or MC_S is connected with two bit lines $BL_0$ and $BL_1$ and one word line $WL_0$ to $WL_n$. The first and second bit lines $BL_0$ and $BL_1$ are extended in, e.g., a y-direction, and the word line $WL_0$ to $WL_n$ is extended in, e.g., a x-direction. The first and second bit lines $BL_0$ and $BL_1$ form one pair of bit lines $BL_0$ and $BL_1$ and are connected with the plurality of memory cells MC and MC_S in common.

The memory cell MC or MC_S is constituted of, e.g., one resistive memory element MTJ or MTJ_S and one selective switch element Tr or Tr_S. The resistive memory element MTJ or MTJ_S and the selective switch element Tr or Tr_S are connected in series.

The resistive memory element MTJ or MTJ_S is, e.g., a magnetoresistive effect element. The selective switch element Tr or Tr_S is, e.g., an MIS (Metal-Insualtor-Semiconductor) transistor. The MIS transistor that functions as the selective switch element will be referred to as a select transistor hereinafter.

As explained above, the memory cell according to this embodiment has a 1Tr+1MTJ structure.

FIG. 2 shows a cross-sectional structure of the magnetoresistive effect element. The magnetoresistive effect element is an element utilizing a magnetic tunnel junction. As shown in FIG. 2, the magnetoresistive effect element MTJ has a laminated structure including a magnetization invariable layer (a ferromagnetic layer) 12A, a magnetization free layer (a ferromagnetic layer) 14A, and a non-magnetic layer (e.g., an insulating film) 13A sandwiched between the magnetization invariable layer 12A and the magnetization free layer 14A. The magnetoresistive effect element MTJ or MTJ_S has connection terminals on, e.g., the magnetization invariable layer (a reference layer) 12A side and the magnetization free layer (a storage layer) 14A side, respectively.

It is to be noted that the magnetoresistive effect element MTJ may have a single junction structure having a single non-magnetic layer, or may have a double junction layer having two non-magnetic layers. The magnetoresistive effect element adopting this double junction structure has a first magnetization invariable layer, a second magnetization invariable layer, a magnetization free layer provided between the first and second magnetization invariable layers, a first non-magnetic layer provided between the first magnetization invariable layer and the magnetization free layer, and a second non-magnetic layer provided between the second magnetization invariable layer and the magnetization free layer. Further, a magnetizing direction of each of the magnetization invariable layer and the magnetization free layer in the magnetoresistive effect element may be a vertical magnetization type, in which a magnetizing direction is vertical to a film surface, or a parallel magnetization type, in which a magnetizing direction is parallel to the film surface. When the magnetoresistive effect element of the parallel magnetization type is used, an antiferromagnetic layer is provided on a surface opposite to a surface of the magnetization invariable layer that is in contact with the non-magnetic layer, for example. The antiferromagnetic layer fixes the direction of magnetization of the magnetization invariable layer.

The select transistor Tr or Tr_S has one current path and a gate electrode (a control terminal).

A connection relationship between constituent elements in the memory cell MC or MC_S and a connection relationship between these constitute elements and the bit lines/word line are as follows.

One end of the magnetoresistive effect element MTJ or MTJ_S is connected with the first bit line $BL_0$ forming the bit line pair, and the other end of the magnetoresistive effect element MTJ or MTJ_S is connected with one end of a current path of the select transistor Tr1 or Tr_S. Moreover, the other end of the current path of the select transistor Tr or Tr_S is connected with the second bit line $BL_1$. One word line $WL_0$ to $WL_n$ is connected with a gate electrode of each select transistor Tr or Tr_S.

A column selective switch (a first column switch) $3_1$ is connected with one end of the bit line $BL_0$. Additionally, a column selective switch (a second column switch) $5_1$ is connected with one end of the second bit line $BL_1$. Each of the column selective switches $3_1$ and $5_1$ is, e.g., an MIS transistor. ON/OFF switching of the first column selective switch $3_1$ is controlled by using a first column selective signal CSWC_1. ON/OFF switching of the second column selective switch $5_1$ is controlled by using a second column selective signal CSWC_2.

A write circuit is connected with each of the first and second bit lines $BL_0$ and $BL_1$ through each of the column selective switches $3_1$ and $5_1$. The column selective switch $3_1$ or $5_1$ has a function as a switch element that causes electrical conduction of the bit line $BL_0$ or $BL_1$ and the write circuit and flows a write current Iw to a selected cell.

The write circuit is formed of, e.g., common interconnect lines 20 and 30 through which potentials Vdd and Vss are supplied to the bit lines $BL_0$ and $BL_1$, and switch circuits 1R, 2R, 1L, and 2L. One switch circuit is formed of, e.g., one P-channel MIS transistor and one N-channel MIS transistor.

The first bit line $BL_0$ is connected with the first common interconnect line (a first common line) 20 through the first column selective switch $3_1$. One end of the common interconnect line 20 is connected with, e.g., a first P-channel MIS transistor 1R, and the other end of the common interconnect line 20 is connected with, e.g., a first N-channel MIS transistor 2R. The current paths of the P-channel MIS transistor 1R and the N-channel MIS transistor 2R are connected in series between a power supply terminal Vdd and a ground terminal Vss.

ON/OFF switching of the first P-channel MIS transistor 1R is controlled by inputting a control signal SWPD_R to a gate of the P-channel MIS transistor 1R. ON/OFF switching of the first N-channel MIS transistor 2R is controlled by inputting a control signal SWNS_R to a gate of the N-channel MIS transistor.

The second bit line $BL_1$ is connected with the second common interconnect line (a second common line) 30 through the second column selective switch $5_1$. One end of the second common interconnect line 30 is connected with, e.g., the second P-channel MIS transistor 1L, and the other end of the common interconnect line 30 is connected with, e.g., the current paths of the second N-channel MIS transistor 2L. The P-channel MIS transistor 1L and the N-channel MIS transistor 2L are connected in series between the power supply terminal Vdd and the ground terminal Vss.

ON/OFF switching of the second P-channel MIS transistor 1L is controlled by inputting a control signal SWPD_L to a gate of the P-channel MIS transistor 1L. ON/OFF switching of the second N-channel MIS transistor 2L is controlled by inputting a control signal SWNS_L to a gate of the N-channel MIS transistor 2L.

A write operation of the MRAM according to this embodiment is executed based on a spin transfer scheme. In the magnetoresistive effect element MTJ depicted in FIG. 2, magnetization reversal based on the spin transfer scheme is performed by injecting each electron (which is called a spin-polarized electron) subjected to spin polarization using a magnetic moment of the magnetization invariable layer 12A into the magnetization free layer 14A and reversing magnetization of the magnetization free layer 14A based on movement of a spin angular momentum caused due to an exchange interaction of the spin-polarized electron and the electron in the magnetization free layer 14A. That is, the write current Iw is flowed from the magnetization invariable layer 12A to the magnetization free layer 14A or from the magnetization free layer 14A to the magnetization invariable layer 12A to set a magnetizing direction of the magnetization free layer 14A and a magnetizing direction of the magnetization invariable layer 12A to an anti-parallel state (e.g., data "0") or a parallel state (e.g., data "1"), thereby writing data. When a potential difference is applied to both ends of the magnetoresistive effect element and the write current Iw that is equal to or above a magnetization reversal threshold current is flowed to reverse the magnetizing direction of the magnetization free layer 14A in this manner, a relationship of the magnetizing directions of the magnetization invariable layer 12A and the magnetization free layer 14A to a parallel state or an anti-parallel state in accordance with a direction of flow of the write current, and a resistance value of the magnetoresistive effect element is changed, thereby writing data "1" or "0".

In the write operation of the MRAM depicted in FIG. 1, the write current Iw flows from one common interconnect line (the write circuit) to the other common interconnect line with respect to a bit line pair to which a selected memory cell (which will be referred to as a selected cell hereinafter) is connected. As a result, data "1" or "0" is written in the magnetoresistive effect element in the selected cell based on the spin transfer scheme.

A description will now be given as to an example where the write current Iw is flowed from the first common interconnect line 20 to the second common interconnect line 30 to write data in the selected cell MC_S connected with a word line $WL_i$ with reference to FIG. 3 in addition to FIG. 1. FIG. 3 is a waveform chart (a timing chart) at the time of a write operation of the MRAM according to the embodiment of the present invention. In FIG. 3, the abscissa indicates a time and the ordinate indicates a signal level (a potential).

First, the control signal SWPD_R is changed from an "H (high)" level to an "L (low)" level and the control signal SWNS_L is changed from the "L" level to the "H" level with respect to the MRAM that is in a standby mode. As a result, the first P-channel MIS transistor 1R as the switch circuit connected with the first common interconnect line 20 is turned on, and the second N-channel MIS transistor 2L connected with the second common interconnect line 30 is turned on.

At this time, the control signal SWPD_L is maintained at the "H" level, and the control signal SWNS_R is maintained at the "L" level. Therefore, the first N-channel MIS transistor 2R and the second P-channel MIS transistor 1L are maintained in the OFF state.

Subsequently, a first column selective signal CSWC_1 is changed from the "L" level to the "H" level. The first column selective switch (the N-channel MIS transistor) $3_1$ is turned on, and the first bit line $BL_0$ becomes electrically conductive with the first common interconnect line 20. At the same time, a second column selective signal CSWC_2 is changed from the "L" level to the "H" level. The second column selective switch (the N-channel MIS transistor) $5_1$ is turned on, and the second bit line $BL_1$ becomes electrically conductive with the second common interconnect line 30.

That is, the selected bit line (e.g., the bit line $BL_0$) is activated, and a signal level selected_BL of the selected bit line is changed from the "L" level to the "H" level. As a result, the power supply potential Vdd is supplied from the first common interconnect line 20 to the first bit line $BL_0$ connected with the selected cell MC_S, and a node of the selected bit line $BL_0$ and the memory cell MC or MC_S (a contact point of the magnetoresistive effect element and the bit line) is charged.

Further, the second bit line $BL_1$ is also activated, and has the same potential as the ground potential Vss supplied from the second common interconnect line 30. At this time, since the word lines $WL_0$ to $WL_n$ are in an inactive state, even if a potential difference occurs between the pair of bit lines $BL_0$ and $BL_1$, no current flows through the selected cell MC_S and the non-selected cell MC. A node charge period is a period that lasts until the node is sufficiently charged and a current in a steady state can be flowed through the selected cell after start of charging the node (start of activation of each bit line).

It is to be noted that, in this example, the P-channel/N-channel MIS transistors 1R and 2L as the switch circuits are turned on, and then the column selective switch $3_1$ is turned on. However, the present invention is not restricted to the operation depicted in FIG. 3, and the column selective switch $3_1$ and $5_1$ may be turned on and then the P-channel/N-channel MIS transistors 1R and 2L as the write switch circuits may be turned on as shown in FIG. 4.

After the power supply potential Vdd is supplied to the first bit line $BL_0$, a signal level selected_WL of the selected word line (the word line $WL_i$ in this example) is changed from the "L" level to the "H" level, and the selected word line $WL_i$ is activated. Potentials of the other non-selected word lines $WL_0$ to $WL_{i-1}$, $WL_{n-1}$, and $WL_n$ are maintained at the "L" level, and they are in an inactive state.

The select transistor Tr_S whose gate is connected with the activated word line $WL_i$ is turned on. As a result, the write current Iw flows from the first common interconnect line 20 to the second common interconnect line 30.

The write current Iw flows from the sufficiently charged node toward the second bit line $BL_1$ through the magnetoresistive effect element MTJ_S and the ON select transistor Tr_S in the selected cell MC_S. As a result, data is written in the magnetoresistive effect element MTJ_S constituting the selected cell MC_S based on the spin transfer scheme.

Further, the write current Iw flows to the ground terminal Vss of the second common interconnect line 30 through the second column selective switch $5_1$ and the second N-channel MIS transistor 2L.

With the above-explained operation, data is written the magnetoresistive effect element MTJ_S in the selected cell MC_S.

It is to be noted that substantially the same operation is performed when the write current Iw flowing from the common interconnect line 30 to the common interconnect line 20 is used to write data in the selected cell MC_S connected with the word line $WL_i$.

That is, the control signal SWPD_L is changed from the "H" level to the "L" level, and the second P-channel MIS transistor 1L is thereby turned on. The control signal SWNS_R is changed from the "L" level to the "H" level, and the first N-channel MIS transistor 1R is thereby turned on.

Furthermore, when the second column selective signal CSWC_2 is changed from the "L" level to the "H" level, a second column selective switch $5_2$ is thereby turned on. Moreover, the first column selective switch $3_1$ is also turned on. The second bit line $BL_1$ as the selective bit line is activated, and the power supply potential Vdd is supplied to the second bit line $BL_1$ from the second common interconnect line 30. As a result, a node of the selected cell MC_S and the bit line $BL_1$ is charged.

After the second bit line $BL_1$ is activated, selected word line (the word line $WL_i$ in this example) is activated. As a result, the select transistor Tr_S is turned on, and the write current Iw flows through the magnetoresistive effect element MTJ_S in the selected cell MC_S. The write current Iw flows to the ground terminal Vss of the first common interconnect line 20 via the first column selective switch $3_1$ and the first N-channel MIS transistor 2R.

When the write current Iw flows from the second common interconnect line 30 toward the first common interconnect line 20 by the above-explained operation, data is written in the magnetoresistive effect element MTJ_S in the selected cell MC_S based on the spin transfer scheme.

In the MRAM according to the embodiment of the present invention, the bit line $BL_0$ connected with the selected cell is activated and then the word line $WL_i$ connected with the selected cell is activated in the write operation as shown in FIG. 3.

As a difference from this embodiment, in an MRAM in which a word line is activated and then a bit line is activated, a timing for activating a selected bit line serves as a trigger of starting injection of a write current into a selected cell. Here, paying attention to the write current, the selected bit line is activated, and then charging respective nodes of the bit line having a potential supplied thereto and a plurality of memory cells connected with this bit line begins. Furthermore, charging the respective nodes is completed, and a write current in a steady state flows through a magnetoresistive effect element of the selected cell. In this case, in a situation where a write current in a non-steady state keeps flowing through the selected cell, respective nodes of the selected pair of bit lines are simultaneously charged, and delay (RC delay) due to an RC time constant included in the bit lines and the plurality of memory cells occurs. Therefore, a relatively long time is required until each node is sufficiently charged and the write current in the steady state reaching a reversal threshold current flows. As explained above, in the MRAM where the word line is activated and then the bit line is activated, a switching speed of each memory cell (the magnetoresistive effect element) is high as compared with a time required for potentials of all the pairs of bit lines selected for writing enter the steady state, but a speed of the write operation of such an MRAM is specified by a charge time of the entire writing system.

In the embodiment according to the present invention, as explained above with reference to FIGS. 1 and 2, the bit line is activated, then the word line is activated, and a timing for activating the word line serves as a trigger for start of injection of the write current into the selected cell.

That is, in the MRAM according to this embodiment, the node of the memory cell and the bit line is charged in a state where the current does not flow to the selected cell while suppressing an influence of delay due to the RC time constant. Therefore, the MRAM according to this embodiment can increase a speed for charging the node as compared with the MRAM that charges the node by activating the word line.

Further, since the node of the selected cell MC_S and the activated selected bit line is sufficiently charged until the word line is activated, the write current Iw in the steady state that has reached the reversal threshold current can be injected into the magnetoresistive effect element.

As explained above, in the MRAM according to this embodiment, a speed for the write operation can be specified by a switching speed of the memory cell (the magnetoresistive effect element).

Therefore, the MRAM according to the embodiment of the present invention can increase a speed of the write operation.

Furthermore, when the selected word line is activated and then the selected bit line is activated, the write current flows through the selected cell in a state where the node of the selected bit line and the selected cell is not sufficiently charged. That is, since the write current in the non-steady state flows through the selected cell (the magnetoresistive effect element) until the node is sufficiently charged, the write operation becomes unstable.

In the MRAM according to this embodiment, the node of the bit line and the selected cell is sufficiently charged before the write current Iw flows through the selected cell. Therefore, the current in the non-steady state does not flow through the selected cell, and the write current Iw in the steady state that has reached a sufficient reversal threshold current can be injected into the magnetoresistive effect element.

Therefore, according to the MRAM of this embodiment, the write current Iw having a stable current value can be used, and the write operation can be stabilized.

(2) Read Operation

A basic structure of a circuit and an operation at the time of a read operation of the MRAM according to an embodiment of the present invention will now be explained. It is to be noted that like reference numerals denote constituent members having the same functions as those of the constituent members depicted in FIGS. 1 and 2 and these members will be explained as required.

FIG. 5 shows primary parts of a circuit configuration of the MRAM when executing a read operation in the MRAM according to the embodiment of the present invention.

As shown in FIG. 5, a plurality of memory cells MC and MC_S are connected with one pair of bit lines $BL_0$ and $BL_1$.

In the circuit configuration at the time of the read operation, a first column selective switch (e.g., an MIS transistor) $3_1$ is connected with one end of the first bit line $BL_0$, and a second column selective switch (e.g., an MIS transistor) $5_1$ is connected with one end of the second bit line $BL_1$. The first and second column selective switches $5_1$ are connected with first and second common interconnect lines 20 and 30, respectively. When each column selective switch is turned on, charging of each bit line is started.

The first common interconnect line 20 is connected with a sense amplifier 7 through a read switch circuit (e.g., an MIS transistor) $4_1$. One input terminal of the sense amplifier 7 is connected with the first common interconnect line 20, the other input terminal of the same is connected with a ground terminal, and read data is output from an output terminal of the same to the outside (not shown).

An MIS transistor 2L that is controlled by a control signal SWNS_L is connected with the second common interconnect line 30.

The sense amplifier 7 is controlled by a control signal S/A.

Each of the column selective switches $3_1$ and $5_1$ and a read switch circuit $4_1$ functions as a switch element that provokes electrical conduction of the bit lines $BL_0$ and $BL_1$ and the read circuit (the sense amplifier 7) and flows a read current Ir to a selected cell. ON/OFF switching of the read switch circuit $4_1$ is controlled by a read switch control signal RSWC. The read current Ir is generated by a supply source (not shown) in the read circuit.

A read operation of the MRAM according to this embodiment is executed by utilizing the tunneling magnetoresistive effect. That is, at the time of the read operation, in the bit line pair connected with a cell selected for reading, a read current is flowed through the selected cell. A resistance value of a magnetoresistive effect element MTJ_S in the selected cell MC_S differs depending on data "0" or data "1". Therefore, a potential fluctuation amount of the bit line $BL_0$ connected with the sense amplifier 7 differs in accordance with a resistance value of a magnetoresistive effect element. The sense amplifier 7 detects a potential fluctuation amount associated with data and discriminates data in the selected cell MC_S. As a result, data in the selected cell is read.

Figure 6:
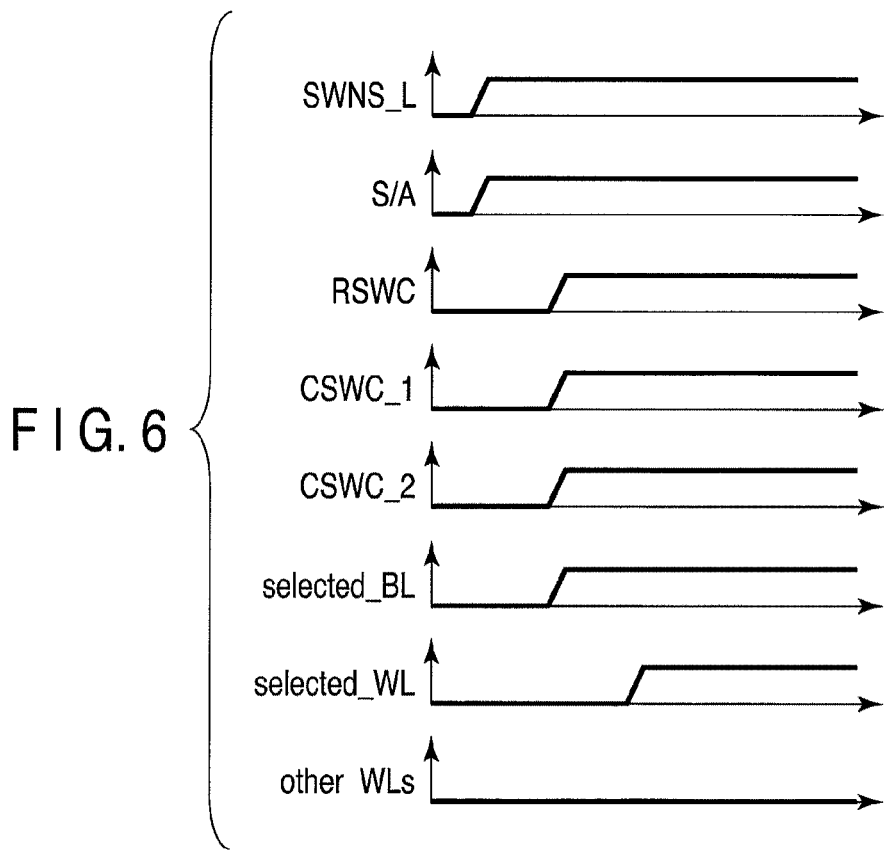
FIG. 6 is a waveform chart for explaining an operation of a semiconductor memory according to an embodiment of the present invention.

The read operation of the MRAM according to this embodiment will now be explained with reference to FIG. 6 in addition to FIG. 5. FIG. 6 is a waveform chart (a timing chart) at the time of the read operation of the MRAM according to the embodiment of the present invention.

First, a potential of the control signal S/A of the sense amplifier is changed from an "L" level to an "H" level with respect to the MRAM that is in a standby mode. As a result, the sense amplifier 7 is turned on. Furthermore, an N-channel MIS transistor 2L is also turned on by the control signal SWNS_L.

Then, the read switch control signal RSWC is changed from the "L" level to the "H" level, and the read switch circuit $4_1$ is enabled. With this change, first and second column selective signals CSWC_1 and CSWC_2 are changed from the "L" level to the "H" level, and the first and second column selective switches (the MIS transistors) $3_1$ and $5_1$ are turned on.

As a result, the first bit line $BL_0$ becomes electrically conductive with respect to the sense amplifier (the read circuit) 7. That is, the selected bit line (the first bit line $BL_0$ in this example) is activated, and a signal level selected_BL of the selected bit line $BL_0$ is changed from the "L" level to the "H" level. As a result, a potential from the read circuit is supplied to the first bit line $BL_0$ connected with the selected cell MC_S. Further, each node of the first bit line $BL_0$ and the memory cell MC or MC_S is charged. Furthermore, the second bit line $BL_1$ is also activated, and a potential of the bit line $BL_1$ becomes a ground potential Vss. At this time, since the word lines $WL_0$ to $WL_n$ are inactive, even if a potential difference between the bit lines $BL_0$ and $BL_1$ occurs, no current flows through the selected cell MC_S and the non-selected cell MC.

However, the potential supplied to the first bit line $BL_0$ is a potential smaller than a potential that generates a reversal threshold current in order to avoid erroneous writing with respect to a memory cell selected for reading.

It is to be noted that the sense amplifier 7 is turned on and then the read switch circuit $4_1$ and the column selective switches $3_1$ and $5_1$ are turned on in FIG. 6, but the present invention is not restricted thereto. For example, as shown in FIG. 7, the sense amplifier 7 may be turned on after the read switch circuit $4_1$ and the column selective switches $3_1$ and $5_1$ are turned on and after the selected bit line is activated. That is because charging the selected bit line starts simultaneously upon turning on the N-channel MIS transistor 2L and the column selective switches $3_1$ and $5_1$ by using the control signal SWNS_L, CSWC_1, or CSWC_2.

The selected bit line $BL_0$ is activated, then the selected word line (the word line $WL_i$ in this example) is activated, and a signal level selected_WL of the selected word line $WL_i$ is set to the "H" level from the "L" level. Potentials of the other word lines (non-selected word lines) $WL_0$ to $WL_{i-1}$, $WL_{n-1}$, and $WL_n$ are maintained at the "L" level.

A select transistor Tr_S whose gate is connected with the activated word line $WL_i$ is turned on, and a read current Ir flows through the selected cell MC_S. The read current Ir flows toward the second bit line $BL_1$ from a sufficiently charged node through the magnetoresistive effect element MTJ_S and the select transistor Tr_S in the selected cell MC_S.

When the read current Ir flows through the magnetoresistive effect element MTJ_S, a potential of the bit line $BL_0$ fluctuates in accordance with a resistance value (data "0" or data "1") of the magnetoresistive effect element MTJ_S, and the sense amplifier 7 detects this fluctuation amount.

As a result, data stored in the magnetoresistive effect element MTJ_S in the selected cell MC_S is determined as data "0" or data "1".

The read current Ir flows toward the ground terminal Vss of the common interconnect line 30 through the second column selective switch $5_1$ and the MIS transistor 2L.

With the above-explained operation, data is read from the magnetoresistive effect element MTJ_S in the selected cell MC_S. It is to be noted that the word line may be activated and then the sense amplifier 7 may be turned on as shown in FIG. 8.

According to the MRAM of the embodiment of the present invention, in the read operation, as shown in FIG. 6, the bit line $BL_0$ is activated, a potential is supplied to the bit line $BL_0$ connected with the selected cell, and then the selected word line $WL_i$ is activated. That is, in the MRAM according to this embodiment, at the time of the read operation, a timing for activating the word line serves as a trigger of starting injection of the read current into the selected cell like the write operation.

As the read current, a current that is approximately ⅕ to ½ of the write current is usually utilized in order to avoid erroneous writing into the magnetoresistive effect element. Therefore, charging the node of the bit line and each memory cell requires a longer time than that required by charging the node in the write operation.

In the MRAM according to this embodiment, as explained above, the bit line $BL_0$ is activated, and then the word line $WL_i$ is activated. That is, in the MRAM according to this embodiment, the node is charged in advance in a state where the read current does not flow through the selected cell MC_S, and then injecting the read current into the selected cell MC_S can be started. Therefore, in the MRAM according to the embodiment of the present invention, each node can be rapidly charged as compared with a case in which each node is charged in a state where the read current in a non-steady state flows, as in conventional MRAM.

Thus, according to the MRAM of the embodiment of the present invention, a speed of the read operation can be increased.

Moreover, in order to rapidly charge each node, a current/potential (e.g., approximately Vdd/2) larger than the read current may be supplied to the bit line by using a pre-charge circuit (not shown) to charge the node in some cases. However, considering erroneous latching (erroneous writing) in the read operation, it is preferable for a potential of each of the bit lines $BL_0$ and $BL_1$ to be a potential close to the ground potential Vss. Additionally, in the case of charging using the pre-charge circuit, since a large potential/current is used, a power consumption of the MRAM is thereby increased, and utilizing the pre-charge circuit is not preferable. Further, providing the pre-charge circuit results in an increase in chip size.

On the other hand, in the MRAM according to this embodiment, since a current larger than the read current Ir does not have to be used, erroneous writing does not have to be considered, and a power consumption is not increased.

Furthermore, in the MRAM according to this embodiment, the read current Ir can be injected into the selected cell after the node is sufficiently charged. Therefore, in the MRAM according to this embodiment, data of the magnetoresistive effect element MTJ_S in the selected cell MC_S can be discriminated by using the read current Ir which is in the steady state. This can assuredly improve discrimination of data, i.e., certainty of the read operation.

As explained above, according to the MRAM of the embodiment of the present invention, a speed of the read operation can be increased. Moreover, the read operation can be stabilized.

(3) Finalization of Write/Read Operations

An operation at the end of the write and read operations in the MRAM according to this embodiment will now be explained with reference to FIGS. 9 and 10.

Figure 9:
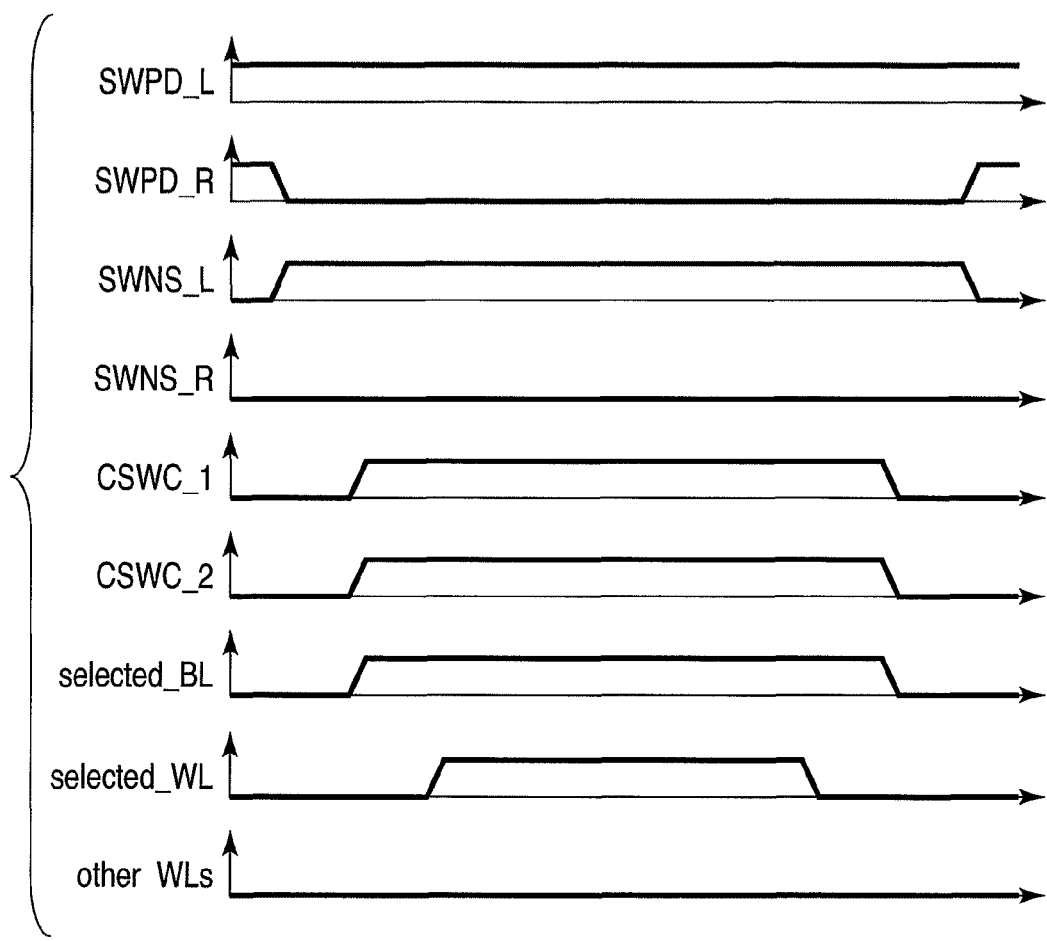
FIG. 9 is a waveform chart for explaining an operation of a semiconductor memory according to an embodiment of the present invention.

FIG. 9 shows a waveform chart of each control signal at the end of the write operation in the MRAM according to the embodiment of the present invention. A circuit configuration of the MRAM will now be explained with reference to FIG. 1.

As shown in FIG. 9, at the start of the write operation, in the MRAM according to this embodiment, the column selective switch $3_1$ or $5_1$ is turned on by the column selective signal CSWC_1 or CSWC_2, and a potential is supplied from the write circuit to the selected bit line, e.g., the first bit line $BL_0$. The selected bit line $BL_0$ is activated, then the selected word line, e.g., the word line $WL_i$ is activated, and the signal level selected_WL of this word line $WL_i$ is changed from the "H" level to the "L" level.

At the end of the write operation, after data is written in the selected cell MC_S, the signal level selected_WL of, e.g., the selected word line $WL_i$ is changed from the "H" level to the "L" level and the selected word line $WL_i$ is deactivated in the MRAM according to this embodiment.

Thereafter, a potential of the first column selective signal CSWC_1 is changed from the "H" level to the "L" level, and the column selective switch $3_1$ is turned off. At the same time, a potential of the second column selective signal CSWC_2 is changed from the "H" level to the "L" level, and the second column selective switch $5_1$ is turned off. As a result, the selected bit line $BL_0$ is deactivated, and the signal level selected_BL of the selected bit line $BL_0$ is changed from the "H" level to the "L" level.

Subsequently, the first P-channel MIS transistor 1R and the second N-channel transistor 2L as the switch elements of the write circuit are turned off. As a result, the write circuit enters the OFF state.

With the above-explained steps, the write operation of the MRAM according to this embodiment is finalized.

In this manner, a timing for finalizing the write operation with respect to the memory cell can be clearly specified in the MRAM according to the embodiment of the present invention.

It is to be noted that the column selective switch $3_1$ or $5_1$ may be turned off after the first P-channel MIS transistor 1R and the second N-channel transistor 2L are turned off as shown in FIG. 10.

Figure 11:
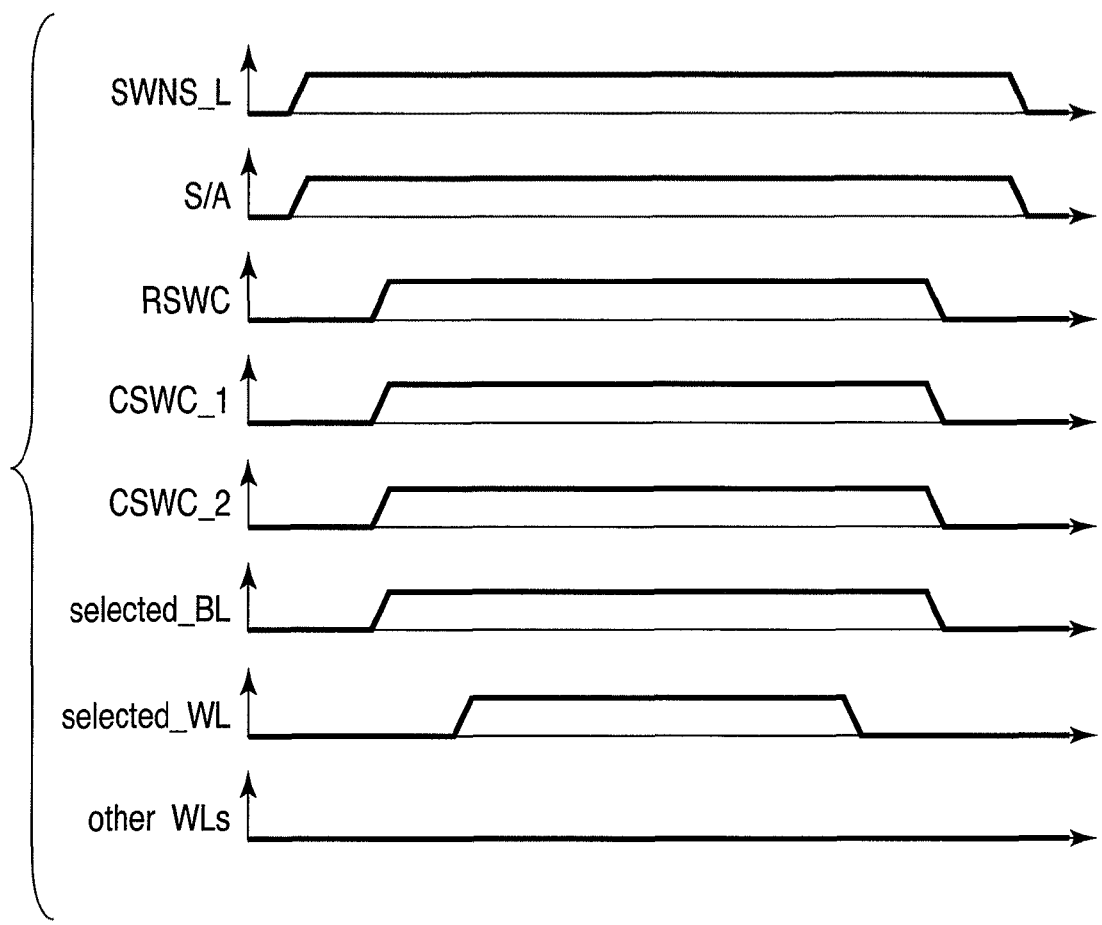
FIG. 11 is a waveform chart for explaining an operation of a semiconductor memory according to an embodiment of the present invention.

FIG. 11 is a waveform chart of each control signal at the end of the read operation of the MRAM according to the embodiment of the present invention. The circuit configuration of the MRAM will be explained with reference to FIG. 5.

As shown in FIG. 11, at the start of the read operation, in the MRAM according to this embodiment, the read switch circuit $4_1$ is enabled by the switch control signal RSWC. With this switching, the column selective switch $3_1$ or $5_1$ is turned on by the column selective signal CSWC_1 or CSWC_2. The selected bit line, e.g., the first bit line $BL_0$ is activated, and the signal level selected_BL of this bit line $BL_0$ is changed from the "L" level to the "H" level. Further, a potential is supplied from the read circuit (the supply source) to the selected bit line $BL_0$ through the read switch circuit $4_1$ and the column selective switch $3_1$ or $5_1$.

The bit line $BL_0$ is activated (charged), then the selected word line, e.g., the word line $WL_i$ is activated, and data is read from the selected magnetoresistive effect element.

At the end of the read operation, after data is read from the selected cell MC_S, for example, the selected word line $WL_i$ is deactivated and the signal level selected_WL of the selected word line $WL_i$ is changed from the "H" level to the "L" level in the MRAM according to this embodiment.

After the selected word line is deactivated, the read switch control signal RSWC is changed from the "H" level to the "L" level, and the read switch circuit $4_1$ is disabled. With this switching, the column selective signal CSWC_1 or CSWC_2 is changed from the "H" level to the "L" level, and the column selective switch $3_1$ or $5_1$ is turned off. As a result, the selected bit line $BL_0$ is deactivated, and the signal level selected_BL of the selected bit line is changed from the "H" level to the "L" level.

Subsequently, the sense amplifier 7 is turned off. With this switching, the N-channel MIS transistor 2L is also turned off.

With the above-explained steps, the read operation of the MRAM according to this embodiment is finalized.

As explained above, in the MRAM according to the embodiment of the present invention, a timing for finalizing the read operation with respect to the memory cell can be clearly specified.

It is to be noted that the read switch circuit $4_1$ and the column selective switch $3_1$ or $5_1$ may be turned off after the sense amplifier 7 is turned off as shown in FIG. 12.

As explained above, in the MRAM according to the embodiment of the present invention, after writing or reading data with respect to the selected cell (the magnetoresistive effect element) is performed, the selected word line is deactivated, and then the selected bit line is deactivated. As a result, in the MRAM according to the embodiment of the present invention, the end of the write/read operation is specified.

In particular, in the write operation of the MRAM, after writing data in the selected cell is finalized, an excessive current does not flow through a space between the pair of bit lines $BL_0$ and $BL_1$, thereby avoiding erroneous writing in memory cells other than the selected cell.

Therefore, according to the MRAM of the embodiment of the present invention, the write/read operation of the MRAM can be stabilized.

It is to be noted that the write switch circuit may be enabled after the column selective switch is turned on in the write operation explained with reference to FIG. 9, like the example described in conjunction with FIG. 4.

In the read operation explained with reference to FIG. 11, the sense amplifier may be turned on after the column selective switch and the read selective switch are turned on, like the example described in conjunction with FIG. 7. Further, in the read operation depicted in FIG. 11, the sense amplifier may be turned on after the selected word line is turned on, like the example described in conjunction with FIG. 8.

[2] EXAMPLES

Examples of the MRAM described in the basic example will now be explained hereinafter with reference to FIGS. 13 to 21.

(1) Circuit Example 1 of Write Circuit

A circuit example 1 of the MRAM according to the embodiment of the present invention will now be explained with reference to FIG. 13. It is to be noted that, in FIG. 13, like reference numerals denote constituent members having the same functions as those of the constituent members depicted in FIG. 1 or 5 and these members will be explained as required.

Figure 13:
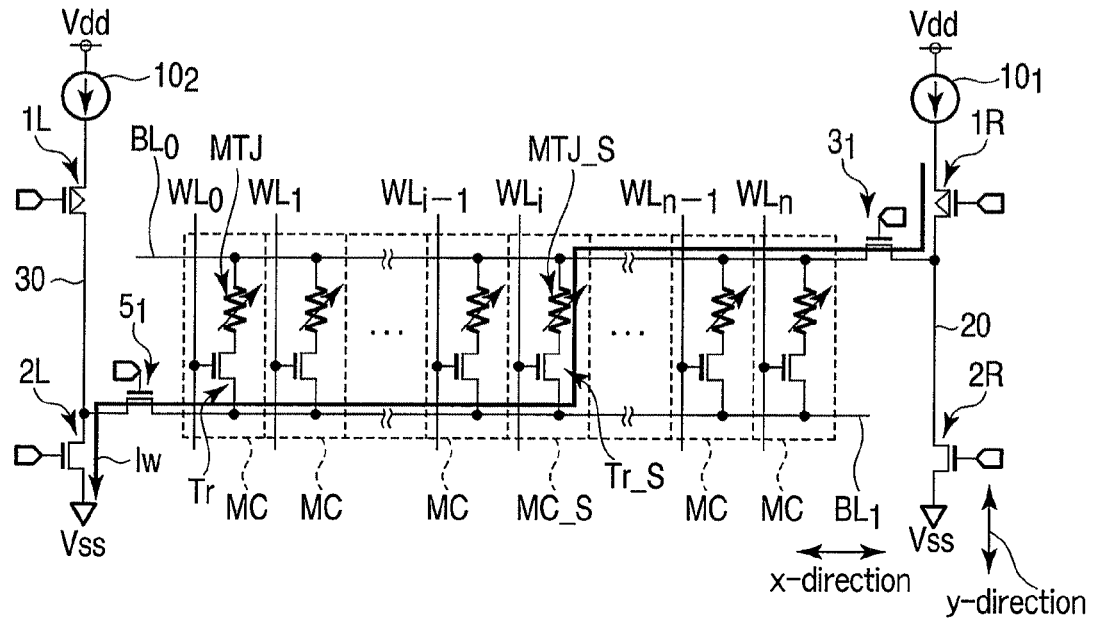
FIG. 13 is an equivalent circuit diagram showing a circuit example of a semiconductor memory according to an embodiment of the present invention.

FIG. 13 is an equivalent circuit diagram showing an example of the write circuit of the MRAM according to this embodiment.

The MRAM shown in FIG. 13 is an example using constant-current sources $10_1$ and $10_2$ as supply sources of a write current Iw.

The first constant-current source $10_1$ is connected between a power supply terminal Vdd of a first common interconnect line 20 and a first P-channel MIS transistor 1R in series, for example.

The second constant-current source $10_2$ is connected between a power supply terminal Vdd of a second common interconnect line 30 and a second P-channel MIS transistor 1L in series, for example.

The write circuit including the constant-current sources $10_1$ and $10_2$, the P-channel/N-channel MIS transistors 1R, 2R, 1L, and 2L has a so-called driver/sinker circuit configuration of the MRAM.

When the constant-current source $10_1$ and $10_2$ are used as the write power supply circuits in this manner, a write current Iw having a predetermined current value can be supplied to a pair of bit lines $BL_0$ and $BL_1$ and memory cells. Usually, a reversal threshold current of a magnetoresistive effect element fluctuates in accordance with each element. As shown in FIG. 13, a current value equal to or above a maximum value in fluctuations of the reversal threshold current can be set by using the constant-current sources $10_1$ and $10_2$, and this current can be supplied to a selected cell as a write current. As a result, a data writing failure with respect to the magnetoresistive effect element can be suppressed.

Therefore, controllability of the write operation of the MRAM according to this embodiment can be improved, and assuredness of writing data with respect to a selected cell can be enhanced.

Accordingly, as shown in FIG. 13, when the write circuit using the constant-current source is configured, the write operation can be stabilized in the MRAM according to the embodiment of the present invention.

(2) Circuit Example 2 of Write Circuit

A circuit example 2 of the MRAM according to the embodiment of the present invention will now be explained with reference to FIG. 14. It is to be noted that, in FIG. 14, like reference numerals denote constituent members having the same functions as the constituent members depicted in FIGS. 1, 5, and 13 and these members will be explained as required.

Figure 14:
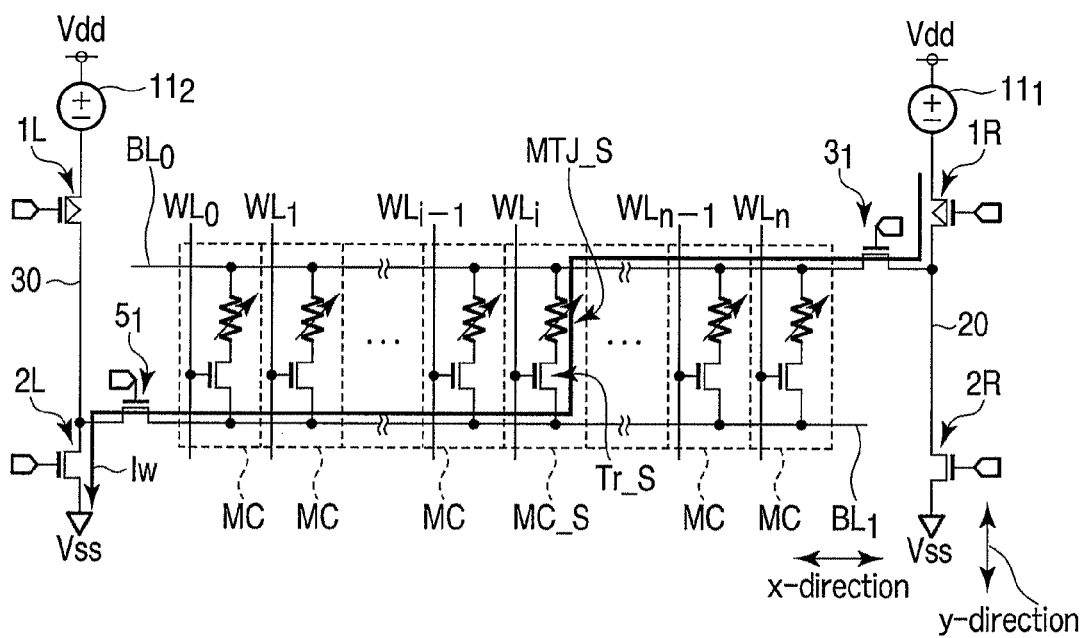
FIG. 14 is an equivalent circuit diagram showing a circuit example of a semiconductor memory according to an embodiment of the present invention.

FIG. 14 is an equivalent circuit diagram showing an example of the write circuit of the MRAM according to this embodiment.

The MRAM shown in FIG. 14 is an example using constant-voltage sources $11_1$ and $11_2$ as write power supply circuits serving as supply sources of a write current Iw.

The first constant-voltage source $11_1$ is connected between a power supply terminal Vdd of a first common interconnect line 20 and a first P-channel MIS transistor 1R in series, for example.

The second constant-voltage source $11_2$ is connected between a power supply terminal Vdd of a second common interconnect line 30 and a second P-channel MIS transistor 1L in series, for example.

The constant-voltage sources $11_1$ and $11_2$, the P-channel MIS transistors 1R and 1L, and N-channel MIS transistors 2R and 2L have a so-called driver/sinker circuit configuration of the MRAM.

When the constant-voltage sources $11_1$ and $11_2$ are used as the write power supply circuits in this manner, a voltage having a predetermined value can be stably supplied to a bit line $BL_0$.

Moreover, when the constant-voltage sources $11_1$ and $11_2$ exemplified in FIG. 14 are used, a current that is equal to or above a maximum value in fluctuations in a reversal threshold current of memory cells can be generated as a write current Iw. Therefore, when the write circuit using the constant-voltage sources is configured, a writing failure with respect to a selected cell in the MRAM can be prevented from occurring.

Additionally, since a large potential can be stably supplied to the bit line in the write operation of the MRAM, a speed of charging the bit line and that of charging a node of a bit line and each memory cell can be increased.

Further, since each of the constant-voltage sources $11_1$ and $11_2$ has a smaller circuit scale than that of, e.g., a constant-current source using a current mirror circuit, a size of a memory cell array can be increased, or a size of an MRAM chip can be reduced.

As explained above, when the write circuit using the constant-voltage sources is configured as shown in FIG. 14, a speed of the write operation in the MRAM according to the embodiment of the present invention can be increased, and the write operation can be stabilized.

(3) Overall Structural Example

The overall structure of the MRAM according to the embodiment of the present invention will now be explained with reference to FIGS. 15 to 21. It is to be noted that, in FIGS. 15 to 21, like reference numerals denote constituent members having the same functions as those of the constituent members depicted in FIGS. 1 to 14 and these members will be explained as required.

(3-1) Structural Example 1

(a) Circuit Configuration

FIG. 15 shows an overall structural example of an MRAM including a memory cell array, a write circuit, and a read circuit.

As shown in FIG. 15, a memory cell array 100 has a plurality of memory cells MC and MC_S.

The plurality of memory cells MC and MC_S aligned in a direction of extension of bit lines (e.g., a direction y) are connected with a plurality of pairs of bit lines $BL_0$, $BL_1$, $BL_2$, $BL_3$, $BL_{l-1}$, and $BL_l$, respectively, such that each memory cell is connected to each of the pairs of bit lines $BL_0$, $BL_1$, $BL_2$, $BL_3$, $BL_{l-1}$, and $BL_l$. It is to be noted that the three pairs of bit lines $BL_0$, $BL_1$, $BL_2$, $BL_3$, $BL_{l-1}$, and $BL_l$ alone are shown in FIG. 15 for ease of explanation but four or more pairs of bit line can be of course provided.

Word lines $WL_0$ to $WL_n$ are extended in a direction (e.g., a direction x) crossing the direction of extension of the bit lines. Each of the word lines $WL_0$ to $WL_n$ is connected to the plurality of memory cells MC and MC_S which are adjacent to each other in the direction x in common.

A first column selective switch $3_1$, $3_2$, or $3_m$ is connected with one end of the bit line $BL_0$, $BL_2$, or $BL_{l-1}$ in each bit line pair. Furthermore, a second column selective switches $5_1$, $5_2$, or $5_m$ is connected with one end of the bit line $BL_1$, $BL_3$, or $BL_l$ forming each bit line pair with the bit line $BL_0$, $BL_2$, or $BL_{l-1}$.

Each of the first column selective switches $3_1$, $3_2$, and $3_m$ is independently controlled based on a first column selective signal CSWC_1, and each of the second column selective switch $5_1$, $5_2$, and $5_m$ is independently controlled based on a second column selective signal CSWC_2.

The one bit line $BL_0$, $BL_2$, or $BL_{l-1}$ is connected with a first common interconnect line 20 through the first column selective switch $3_1$, $3_2$, or $3_m$. A first constant-current source $10_1$, a first P-channel MIS transistor 1R, and a first N-channel transistor 2R are connected between a power supply terminal Vdd and a ground terminal Vss of the first common interconnect line 20 in series, thereby constituting a write circuit (a driver/sinker).

Moreover, the other bit line $BL_1$, $BL_3$, or $BL_l$ is connected with a second common interconnect line 30 through the second column selective switch $5_1$, $5_2$, or $5_m$. A second constant-current source $10_2$, a second P-channel MIS transistor 1L, and a second N-channel transistor 2L are connected between a power supply terminal Vdd and a ground terminal Vss of the second common interconnect line 30.

In this manner, one write circuit is shared by the plurality of bit lines $BL_0$, $BL_1$, $BL_2$, $BL_3$, $BL_l$, and $BL_{l-1}$. Sharing this write circuit enables reducing a circuit scale and a chip size of the MRAM. It is to be noted that the example where the constant-current sources $10_1$ and $10_2$ are used as write current supply sources is explained herein, but the present invention is not restricted thereto, and constant-voltage sources can be of course used like the example depicted in, e.g., FIG. 14.

One read switch circuit $4_1$ is connected with the second common interconnect line 20, and the read switch circuit $4_1$ is controlled by a switch control signal RSWC. A sense amplifier 7 constituting a read circuit is connected with the common interconnect line 20 through the read switch circuit $4_1$.

In the MRAM depicted in FIG. 15, one read circuit (the sense amplifier) 7 and the read switch circuit $4_1$ are shared by the plurality of pairs of bit lines $BL_0$, $BL_1$, $BL_2$, $BL_3$, $BL_{l-1}$, and $BL_l$. Moreover, in the example depicted in FIG. 15, the write circuit and the read circuit (the sense amplifier) are connected to one common interconnect line 20 in common, and a write current and a read current flow through the same common interconnect lines 20 and 30. Sharing the interconnect lines and the circuits in this manner enables reducing a chip size.

(b) Operations

In the MRAM depicted in FIG. 15, the write operation and the read operation explained with reference to FIGS. 3 and 6 can be executed.

Operations of the MRAM depicted in FIG. 15 will now be explained hereinafter with reference to FIGS. 16 and 17.

Figure 16:
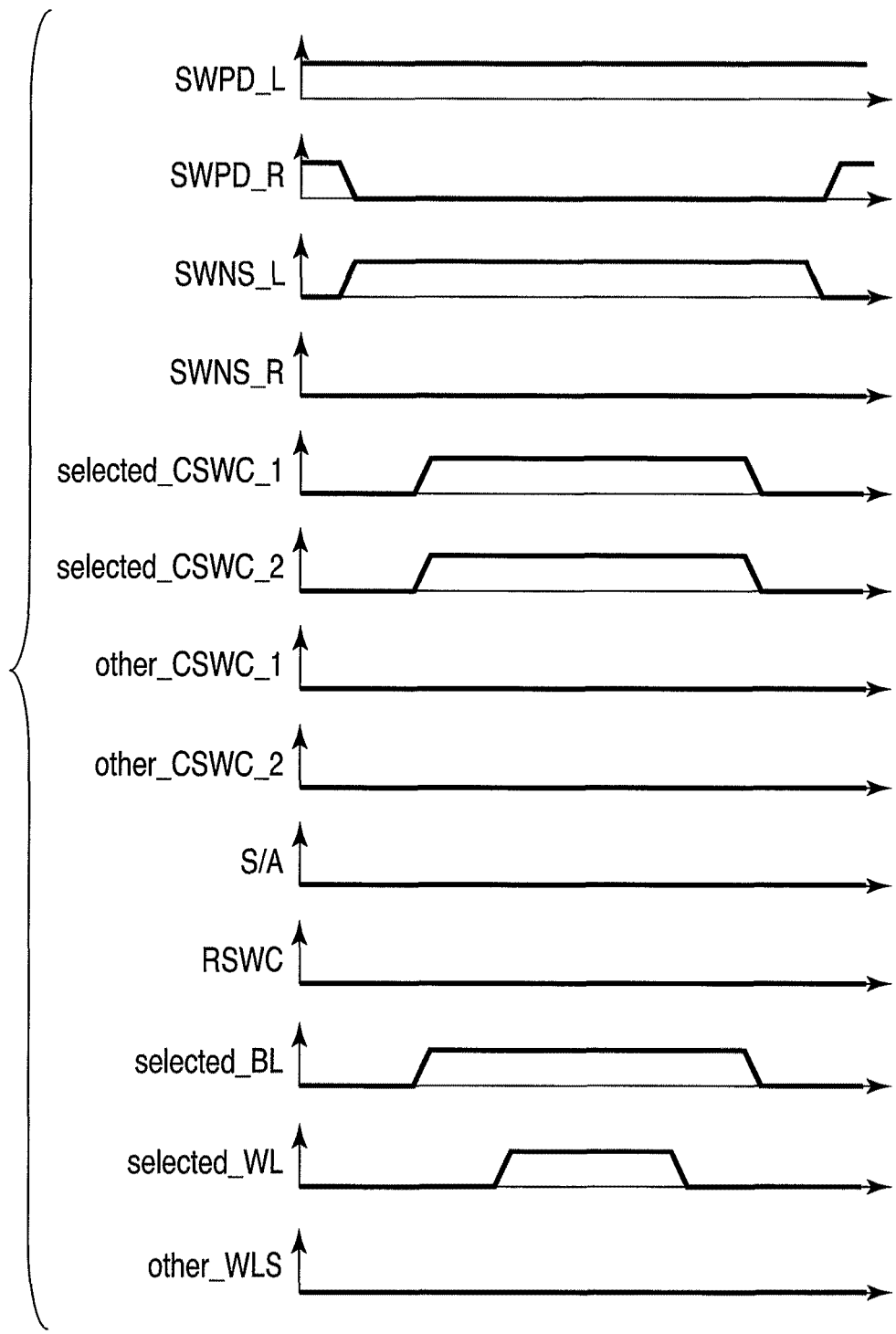
FIG. 16 is a waveform chart for explaining a write operation of the MRAM depicted in FIG. 15.

FIG. 16 is a waveform chart showing a write operation of the MRAM depicted in FIG. 15. A description will be given as to an example where a write current flows from the first common interconnect line 20 to the second common interconnect line 30 and data is written in a selected cell MC_S connected with the pair of bit lines $BL_0$ and $BL_1$.

As shown in FIG. 16, a control signal SWPD_R is first set to the "L" level from the "H" level, and a control signal SWNS_L is set to the "H" level from the "L" level. As a result, the first P-channel MIS transistor 1R and the second N-channel MIS transistor 2L are turned on, thereby driving the write circuit.

Subsequently, a column selective signal selected_CSWC_1 associated with the selected first column selective switch $3_1$ is changed from the "L" level to the "H" level, and the column selective switch $3_1$ connected with the selected bit line $BL_0$ is turned on. On the other hand, a column control signal other_CSWC_1 associated with each of the non-selected first column selective switches $3_2$ and $3_m$ is maintained at the "L" level, and each of the column selective switches $3_2$ and $3_m$ connected with the non-selected bit lines $BL_2$ and $BL_{l-1}$ is turned off.

Further, the second column selective switch $5_1$ connected with the bit line $BL_1$ forming a pair with the selected bit line $BL_0$ is turned on when a second column control signal selected_CSWC_2 associated therewith is set to the "H" level from the "L" level. On the other hand, each of the second column selective switches $5_2$ and $5_m$ connected with the non-selected bit lines $BL_2$ and $BL_{l-1}$ is turned off since a column control signal other_CSWC_2 associated with each of these switches is maintained at the "L" level.

Therefore, the selective bit line $BL_0$ becomes electrically conductive with the first common interconnect line 20 (the write circuit). That is, the selected bit line $BL_0$ is activated, and a write current generated by the constant-current source $10_1$ is supplied to the selected bit line $BL_0$. Based on activation of the selected bit line $BL_0$, each node of the memory cell MC or MC_S and the bit line $BL_0$ is charged, and a potential selected_BL of the selected bit line (the bit line $BL_0$ in this example) is changed from the "L" level to the "H" level. At this time, since the word lines are inactive, each node of the selected bit line is charged in a state where the write current does not flow through the selected cell.

Furthermore, since each of the column selective switches $3_2$ and $3_m$ connected with the non-selected bit lines $BL_2$ and $BL_{l-1}$ is in the OFF state, each of the non-selected bit lines $BL_2$ and $BL_{l-1}$ is not electrically conductive with respect to the first common interconnect line 20. Therefore, the write current does not flow through the non-selected bit lines $BL_2$ and $BL_{l-1}$, and RC delay caused due to the non-selected pairs of bit lines $BL_2$, $BL_3$, $BL_{l-1}$, and $BL_l$ does not slow down charging the selected pair of bit lines $BL_0$ and $BL_1$.

It is to be noted that a read switch control signal RSWC is maintained at the "L" level, and the read switch circuit $4_1$ is in the OFF state. Therefore, the sense amplifier 7 as the read circuit is not electrically conductive with respect to the pairs of bit lines $BL_0$, $BL_1$, $BL_2$, $BL_3$, $BL_{l-1}$, and $BL_l$ during the write operation.

After the selected bit line $BL_0$ is activated, the word line (the word line $WL_i$ in this example) used for the selected cell MC_S is activated. A signal level selected_WL of this selected word line $WL_i$ is changed from the "L" level to the "H" level. As a result, the write current flows into the selected cell MC_S, thereby writing data in the magnetoresistive effect element MTJ_S.

After the data is written in the magnetoresistive effect element MTJ_S in the selected cell, the word line $WL_i$ is deactivated. Subsequently, the selected first and second column selective switches $3_1$ and $5_1$ are turned off by control signals selected_CSWC_1 and selected_CSWC_2 associated with these switches, thereby inactivating the selected bit line $BL_0$. Thereafter, the first P-channel MIS transistor 1R and the second N-channel MIS transistor 2L are also turned off.

With the above-explained operation, the write operation of the MRAM is finalized.

It is to be noted that, when flowing the write current from the second common interconnect line 30 to the first common interconnect line 20, or when executing writing data in the selected cell connected with the pair of bit lines $BL_2$ and $BL_3$ or $BL_{l-1}$ and $BL_l$, control over ON/OFF switching of the column selective switches is different from that in the write operation, and the operation of activating the word line after activating the bit line is the same. Therefore, an explanation will be omitted here. It is to be noted that the write switch circuits 1R and 2L may be enabled after the column selective switch $3_1$ is turned on in the circuit depicted in FIG. 15, like the operation shown in FIG. 4. Further, as explained above in conjunction with FIG. 10, the selected column selective switches $3_1$ and $5_1$ may be turned off after the first P-channel MIS transistor 1R and the second N-channel MIS transistor 2L are turned off at the end of the write operation of the MRAM.

Figure 17:
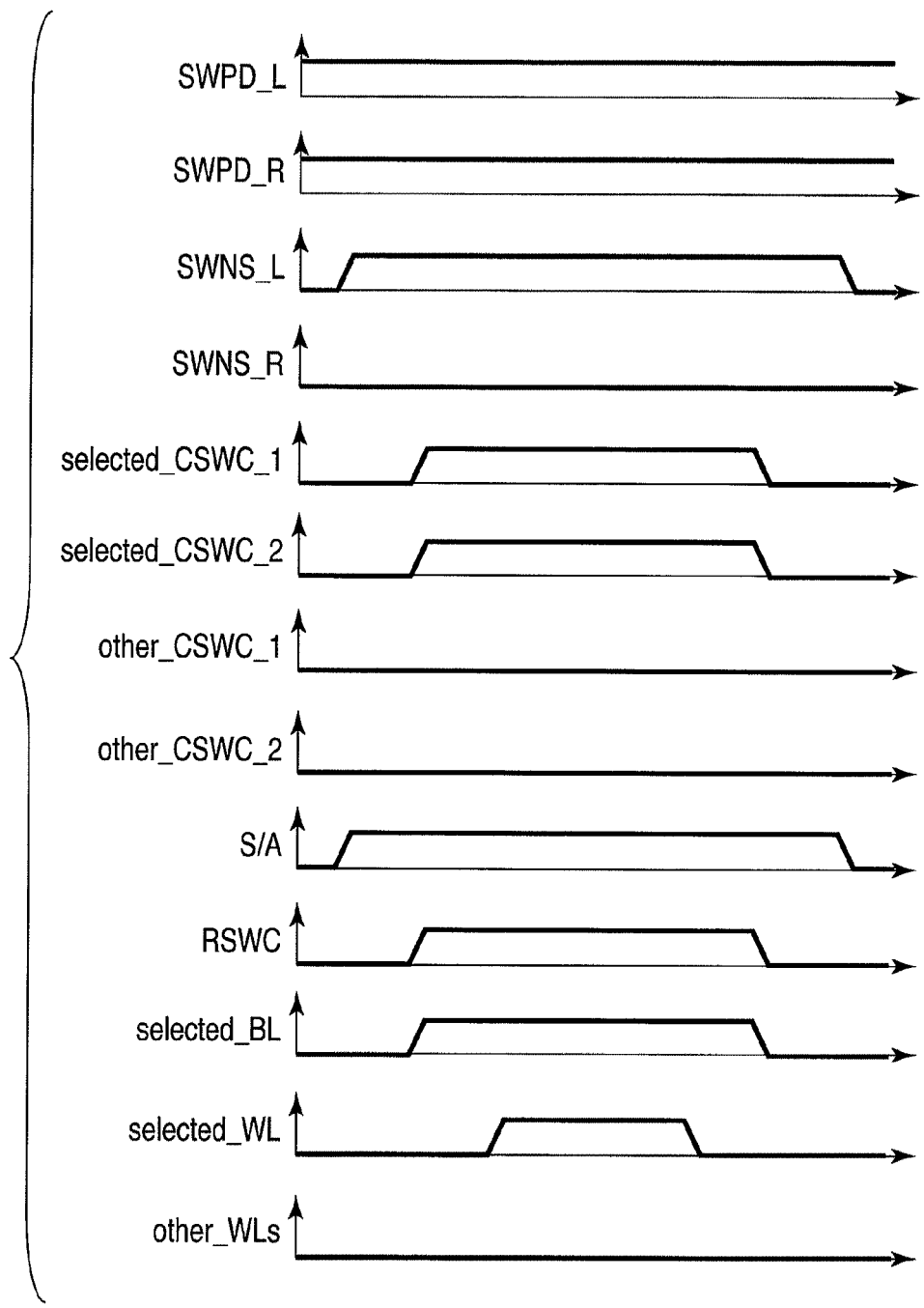
FIG. 17 is a waveform chart for explaining a read operation of the MRAM depicted in FIG. 15.

FIG. 17 is a waveform chart showing a read operation of the MRAM depicted in FIG. 15. An example where a read current is used to read data in the selected cell MC_S connected with the pair of bit lines $BL_0$ and $BL_1$ will be explained.

First, as shown in FIG. 17, a control signal S/A is changed from the "L" level to the "H" level, and the sense amplifier 7 as the read circuit is turned on. At the same time, for example, a control signal SWNS_L is changed from the "L" level to the "H" level, and the second N-channel MIS transistor 2L connected with the second common interconnect line 30 is turned on.

Subsequently, a read switch control signal RSWC is changed from the "L" level to the "H" level, and the read switch circuit $4_1$ is enabled. At the same time, a column selective signal selected_CSWC_1 associated with the selected first column selective switch is changed from the "L" level to the "H" level, and the selected column selective switch $3_1$ is turned on. Furthermore, a column selected signal selected_CSWC_2 associated with the selected second column selective switch is changed from the "L" level to the "H" level, and the selected second column selective switch $5_1$ is turned on.

The selected bit line $BL_0$ becomes electrically conductive with respect to the first common interconnect line 20 through the read switch circuit $4_1$ and the column selective switch $3_1$ which are in the ON state, and the selected bit line $BL_0$ is activated. As a result, a potential (the read current) is supplied to the first bit line $BL_0$ as the selected bit line.

When the selected bit line $BL_0$ is activated, each node of this bit line $BL_0$ and the memory cell MC or MC_S is charged. At this time, since the word lines are inactive, the read current does not flow through the memory cells MC and MC_S. Therefore, each node of the selected bit line is charged in a state where the write current does not flow through the selected cell. It is to be noted the OFF state of each of the non-selected column selective switches $3_2$, $3_m$, $5_2$, and $5_m$ is maintained, and hence the non-selected bit lines $BL_2$ and $BL_{l-1}$ and the read circuit (the sense amplifier 7) are in the non-conductive state.

After each node is charged based on activation of the selected bit line $BL_0$, the word line $WL_i$ utilized for the selected cell MC_S is activated, and a signal level selected_WL of this selected word line $WL_i$ is changed from the "L" level to the "H" level.

As a result, the read current flows through the selected cell MC_S, and data in the magnetoresistive effect element MTJ_S in the selected cell MC_S is discriminated.

The read current flows to the ground terminal Vss of the second common interconnect line 30 through the selected second column selective switch $5_1$ and the second N-channel MIS transistor 2L.

After the data in the magnetoresistive effect element MTJ_S is discriminated, the selected word line $WL_i$ is deactivated. Subsequently, the read switch circuit $4_1$ and the column selective switches $3_1$ and $5_1$ are turned off, and the selected bit line $BL_0$ enters the inactive state. Thereafter, the sense amplifier 7 is disabled. At the same time, the second N-channel MIS transistor 2L is turned off.

With the above-explained operation, the read operation of the MRAM is finalized.

It is to be noted that, when executing reading data in the memory cell connected with the pair of bit lines $BL_2$ and $BL_3$ or $BL_{l-1}$ and $BL_l$, control over ON/OFF switching of the column selective switches is different, but the operation of activating the bit line and then activating the word line is the same. Therefore, its explanation will be omitted here. It is to be noted that, in the circuit depicted in FIG. 15, the sense amplifier 7 may be turned on after the column selective switch $3_1$ and the read selective switch $4_1$ are turned on, like the example explained with reference to FIG. 7. Moreover, like the example explained in conjunction with FIG. 8, the sense amplifier 7 may be enabled after the selected word line $WL_i$ is turned on. Additionally, at the end of the read operation, the read switch circuit $4_1$ and the selected column selective switch $3_1$ or $5_1$ may be turned off after the sense amplifier 7 is turned off, as explained with reference to FIG. 12.

As explained above, according to the MRAM of the embodiment of the present invention, speeds of the write operation and the read operation can be increased.

(3-2) Structural Example 2

(a) Circuit Configuration

Figure 18:
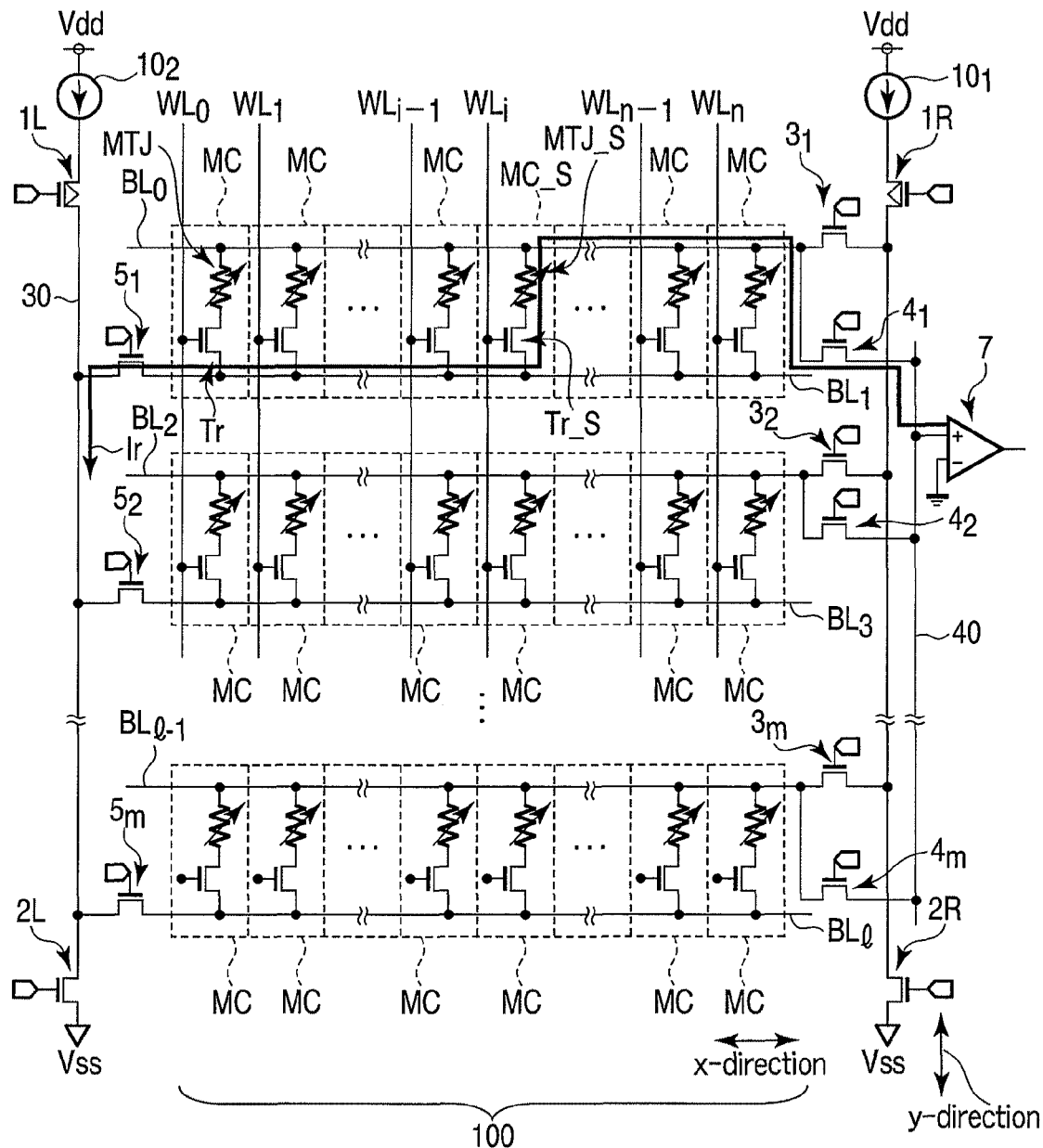
FIG. 18 is an equivalent circuit diagram showing a circuit example of the MRAM according to the embodiment.

A second example of the entire structure of the MRAM according to this embodiment will now be explained with reference to FIG. 18. A description on portions in this example which are equal to the entire structure of the MRAM depicted in FIG. 15 will be omitted.

A first column selective switch $3_1$ and a first read column selective switch $4_1$ are connected with one end of a bit line $BL_0$ forming a pair of bit lines. A first column selective switch $3_2$ or $3_m$ and a first read column selective switch $4_2$ or $4_m$ are likewise connected with one end of a bit line $BL_2$ or $BL_{l-1}$ forming a pair of bit lines, respectively. The plurality of read switch circuits $4_1$, $4_2$, and $4_m$ are individually connected by a read switch control signal RSWC.

Further, a column selective switch $5_1$, $5_2$ or $5_m$ is connected with one end of the other bit line $BL_1$, $BL_3$, or $BL_l$ forming a bit line pair with the one bit line, and it is used for the write operation and the read operation in common.

The plurality of read switch circuits $4_1$, $4_2$, and $4_m$ are connected with a third common interconnect line (a third common line) 40 in common. One sense amplifier 7 is connected with this third common interconnect line 40.

As explained above, in the structure depicted in FIG. 18, different read switch circuits $4_1$, $4_2$, and $4_m$ are provided to the respective pairs of bit lines $BL_0$, $BL_1$, $BL_2$, $BL_3$, $BL_{l-1}$, and $BL_l$. At the same time, in the MRAM according to this example, a write circuit (a driver/sinker) and a read circuit (a sense amplifier) are connected with different interconnect lines. In this case, the same effect as that in the example shown in FIG. 15 can be obtained. Further, in this example, since the write circuit is separated from the read circuit, the operation of the MRAM can be stabilized.

(b) Operations

Figure 19:
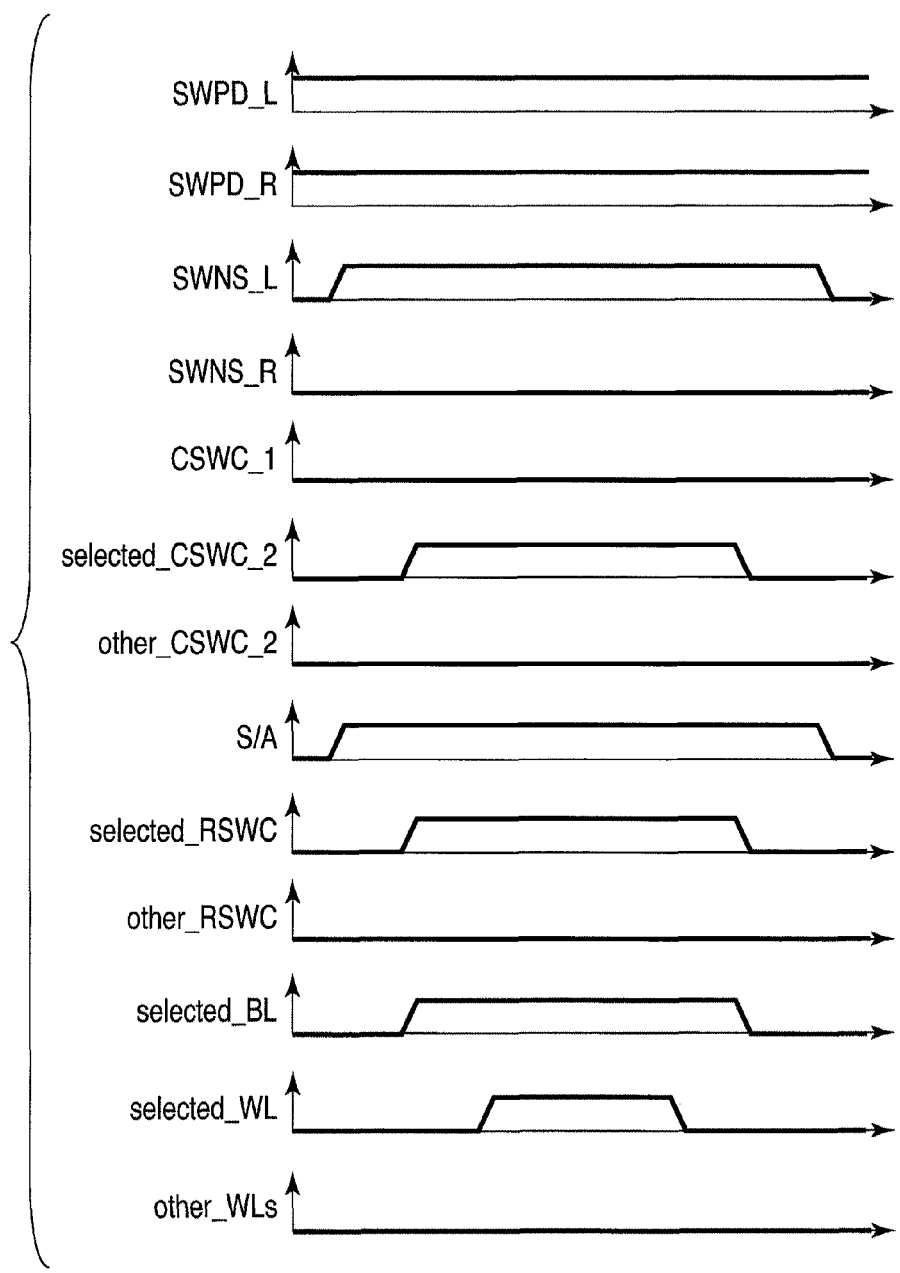
FIG. 19 is a waveform chart for explaining a read operation of the MRAM depicted in FIG. 18.

The operations of the MRAM depicted in FIG. 18 will now be explained hereinafter with reference to FIG. 19. However, the write operation in this example is different from the circuit/operation depicted in FIGS. 15 and 16 in that the plurality of read switch circuits $4_1$, $4_2$, and $4_m$ are all in the OFF state alone, but the write operations of both the examples are substantially the same. Therefore, an explanation of the write operation in this example will be omitted. Thus, the read operation of the MRAM depicted in FIG. 18 alone will be explained. It is to be note that a description will be given as to an example where a read current is used to read data in the selected cell MC_S connected with the pair of bit lines $BL_0$ and $BL_1$.

First, like FIG. 17, the sense amplifier 7 is turned on, and the second N-channel MIS transistor 2L is also turned on.

Subsequently, a control signal selected_RSWC associated with the read switch circuit connected with the selected bit line $BL_0$ is changed from the "L" level to the "H" level, and the selected read switch circuit $4_1$ is enabled. On the other hand, the OFF state of the read switch circuits $4_2$ and $4_m$ connected with non-selected bit lines continues since a control signal other_RSWC associated with these circuits is maintained at the "L" level. At the same time, a column selective signal selected_CSWC_2 associated with the selected second column selective switch is changed from the "L" level to the "H" level, and the selected second column selective switch $5_1$ is turned on. Furthermore, in this example, a column selective signal CSWC_1 of the first column selective switch $3_1$ connected with each of the selected bit line $BL_0$ and the non-selected bit lines $BL_2$ and $BL_{l-1}$ is maintained at the "L" level, and all the first column selective switches $3_1$, $3_2$, and $3_m$ are maintained in the OFF state.

Since the selected read switch circuit $4_1$ is enabled, the selected bit line $BL_0$ becomes electrically conductive with the third common interconnect line 40 and the sense amplifier 7, thereby activating the selected bit line $BL_0$. As a result, a potential (the read current) is supplied to the first bit line $BL_0$ as the selected bit line.

When the selected bit line $BL_0$ is activated, each node of the bit line $BL_0$ and the memory cell MC or MC_S is charged. At this time, since the word lines are inactive, the read current does not flow through the memory cells MC and MC_S. Therefore, each node of the selected bit line is charged in a state where the read current does not flow through the selected cell.

It is to be noted that the OFF state of the non-selected column selective switches $3_1$, $3_2$, $3_m$, $5_2$, and $5_m$ is maintained, and hence the non-selected bit lines $BL_2$ and $BL_{l-1}$ and the read circuit (the sense amplifier 7) are in the non-conductive state.

After each node is charged based on activation of the selected bit line $BL_0$, the word line $WL_i$ utilized for the selected cell MC_S is activated, and a signal level selected_WL of this selected word line $WL_i$ is changed from the "L" level to the "H" level.

As a result, the read current flows through the selected cell MC_S, and data in the magnetoresistive effect element MTJ_S in the selected cell MC_S is discriminated.

Thereafter, based on the same operation as the operation depicted in FIG. 17, the selected word line $WL_i$ is deactivated, and the selected bit line $BL_0$ is deactivated, thereby finalizing the read operation of the MRAM.

As explained above, according to the MRAM of the embodiment of the present invention, speeds of the write operation and the read operation can be increased.

[4] MODIFICATIONS

Figure 20:
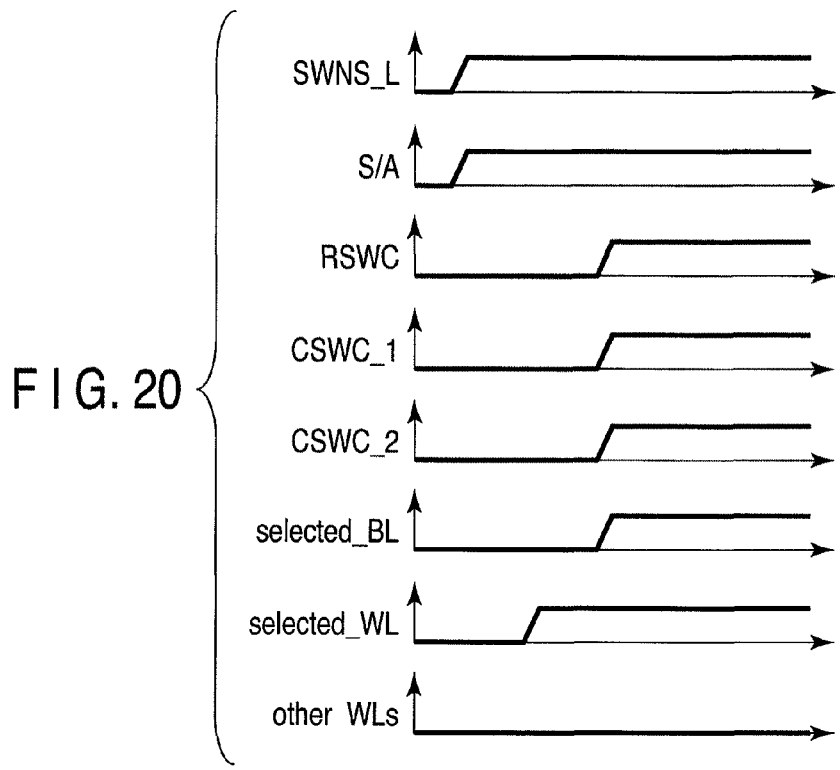
FIG. 20 is a waveform chart for explaining a modification of a semiconductor memory according to an embodiment of the present invention.
Figure 21:
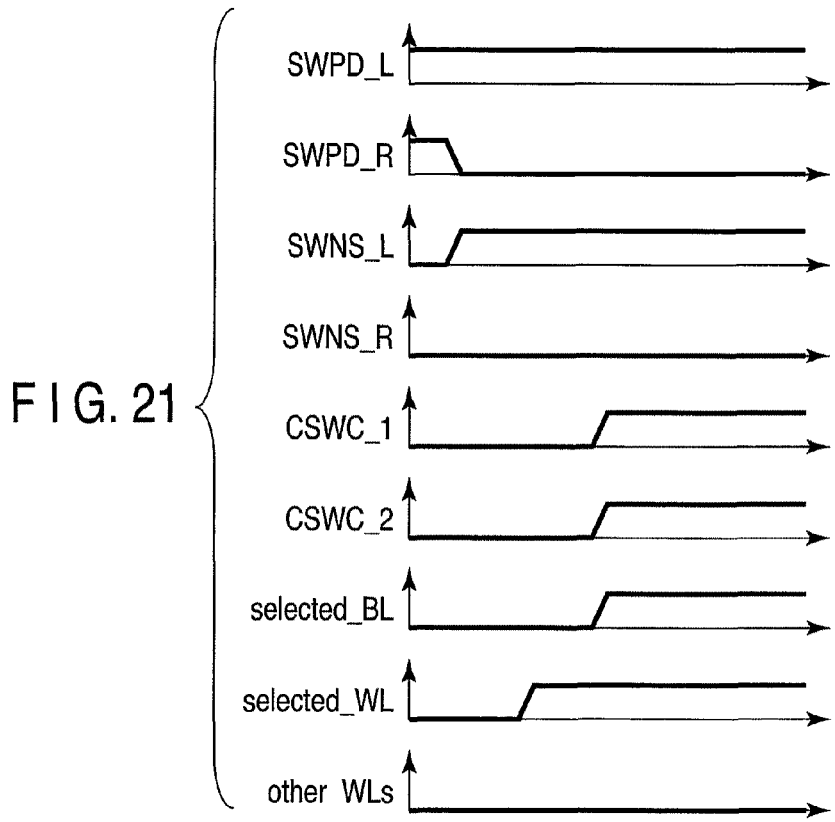
FIG. 21 is a waveform chart for explaining a modification of a semiconductor memory according to an embodiment of the present invention.

Modifications of the MRAM according to the embodiment of the present invention will now be explained with reference to FIGS. 20 and 21.

In the MRAM explained in the basic example, a selected bit line is activated and then a selected word line is activated in both the write operation and the read operation. However, the present invention is not restricted thereto, and a selected bit line may be activated and then a selected word line may be activated in either the write operation or the read operation in the MRAM according to the embodiment of the present invention.

For example, as one modification of the MRAM according to the embodiment of the present invention, a selected bit line is activated and then a selected word line is activated in the write operation as shown in FIG. 2. As a result, data is written in a selected cell. Further, a selected word line is first activated in the read operation as shown in FIG. 20. Then, a selected bit line is activated. Furthermore, a potential is supplied to the selected bit line. Consequently, data is read from the selected cell.

Furthermore, as another modification of the MRAM according to the embodiment of the present invention, a selected bit line is activated and then a selected word line is activated in the read operation as depicted in FIG. 6. Consequently, data is read from a selected cell. In the write operation, a selected word line is activated and then a selected bit line is activated as shown in FIG. 21. Additionally, a current/potential is supplied to the selected bit line from the write circuit. As a result, the write current is injected into the selected cell, and data is written in the magnetoresistive effect element.

In such a case, in the MRAM according to the modification of the embodiment of the present invention, a speed of either the write operation or the read operation can be increased.

3. Others

According to the embodiment of the present invention, speeds of the write operation and the read operation of the MRAM can be increased.

In the embodiment of the present invention, when a selected word line is activated after a selected bit line is charged, an order of turning on/off the write circuit and the read circuit may be appropriately changed.

In the embodiment according to the present invention, the MRAM has been taken as the example to explain the write operation and the read operation thereof. However, the embodiment of the present invention is not restricted to the MRAM.

For example, the present invention can be applied to a ReRAM utilizing a characteristic that a resistance value varies upon application of a pulse voltage to a resistive memory element or a PCRAM utilizing a characteristic that a resistance value varies when a write current is flowed through a resistive memory element to change a phase of a crystal structure of the element. When the embodiment of the present invention is applied to the ReRAM or the PCRAM, the same effect as that of the embodiment of the present invention can be of course obtained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:
1. A semiconductor memory comprising:
first and second bit lines;
a word line not parallel to either the first or second bit line;
a resistive memory element comprising a first end and a second end, the first end being connected with the first bit line;

a selective switch element comprising a current path and a control terminal, a first end of the current path being connected with the second end of the resistive memory element, a second end of the current path being connected with the second bit line, the control terminal being connected with the word line;

a first column switch connected with the first bit line;

a second column switch connected with the second bit line;

a first common line connected with the first bit line through the first column switch; and a second common line connected with the second bit line through the second column switch, wherein while starting writing or reading data with respect to the resistive memory element, after a bit line to be set to a high level in the first and second bit lines is activated and charged from a low level to a high level, the word line is configured to be activated.

2. The semiconductor memory of claim 1, wherein the word line is configured to be deactivated and the first and the second bit lines are configured to be deactivated while finalizing writing or reading data with respect to the resistive memory element.

3. The semiconductor memory of claim 1, further comprising:

a write switch circuit connected with at least one of the first and second common lines; and a write power supply circuit connected with at least one of the first and second common lines through the write switch circuit.

4. The semiconductor memory of claim 3, wherein the write switch circuit is configured to be enabled and the first and second column switches are configured to be turned on before the first and second bit lines are activated while writing data in the resistive memory element.

5. The semiconductor memory of claim 3, wherein the first and second column switches are configured to be turned off and the write switch circuit is configured to be disabled after data is written in the resistive memory element and the word line is deactivated.

6. The semiconductor memory of claim 1, further comprising:

a read switch circuit connected with at least one of the first and second common lines; and a read circuit connected with at least one of the first and second common lines through the read switch circuit, wherein the read switch circuit is configured to be enabled and the first and second column switches are configured to be turned on before the first and second bit lines are activated while reading data from the resistive memory element.

7. The semiconductor memory of claim 1, further comprising:

a read switch circuit connected with at least one of the first and second bit lines;

a third common line connected with the read switch circuit; and a read circuit connected with the third common line, wherein the read switch circuit is configured to be enabled before the first and second bit lines are activated while reading data from the resistive memory element.

8. The semiconductor memory of claim 1, wherein the resistive memory element is configured to utilize a tunneling magnetoresistive effect.

9. The semiconductor memory of claim 3, wherein the write power supply circuit comprises a constant-current source.

10. The semiconductor memory of claim 3, wherein the write power supply circuit comprises a constant-voltage source.

11. A semiconductor memory comprising:

a plurality of pairs of bit lines each comprising a first bit line and a second bit line;

a plurality of word lines not parallel to either the bit lines;

a plurality of resistive memory elements each comprising a first end and a second end, the first end being connected with the first bit line in each pair;

a plurality of selective switch elements each comprising a first current path and a first control terminal, a first end of the first current path being connected with one of the second ends of the resistive memory elements, a second end of the first current path being connected with the second bit line in each pair, the first control terminal being connected with one of the word lines;

a plurality of first column switches each of which is connected with a first end of the first bit line in each pair;

a plurality of second column switches each of which is connected with a first end of the second bit line in each pair;

a first common line connected with the first bit line in each of the plurality of pairs in common through each of the plurality of first column switches; and a second common line connected with the second bit line in each of the plurality of pairs in common through each of the plurality of second column switches, wherein while starting writing or reading data with respect to a selected resistive memory element in the plurality of resistive memory elements, after a bit line to be set to a high level in the first and the second bit lines of a selected bit line pair in the plurality of bit line pairs is activated and charged from a low level to the high level, a selected word line in the plurality of word lines is configured to be activated.

12. The semiconductor memory of claim 11, wherein the selected word line is configured to be deactivated and the selected bit line pair is configured to be deactivated while finalizing writing or reading data with respect to the selected resistive memory element.

13. The semiconductor memory of claim 11, further comprising:

a write switch circuit connected with at least one of the first and second common lines; and a write power supply circuit connected with at least one of the first and second common lines through the write switch circuit.

14. The semiconductor memory of claim 13, wherein the write switch circuit is configured to be enabled before the selected bit line pair is activated while writing data in the selected resistive memory element, and first and second column switches connected with the selected bit line pair in the plurality of first and second column switches are configured to be turned on after the write switch circuit is enabled.

15. The semiconductor memory of claim 13, wherein the selected first and second column switches are configured to be turned off and the write switch circuit is configured to be disabled after data is written in the selected resistive memory element and the selected word line is deactivated.

16. The semiconductor memory of claim 11, further comprising:

a read switch circuit connected with at least one of the first and second common lines; and a read circuit connected with at least one of the first and second common lines through the read switch circuit, wherein the read switch circuit is configured to be enabled before the selected bit line pair is activated while reading data from the selected resistive memory element.

17. The semiconductor memory of claim 11, further comprising:
a plurality of read switch circuits each of which is connected with a first end of a bit line in each of the plurality of pairs of bit lines;
a third common line connected with the bit line in each of the plurality of pairs of bit lines in common through the read switch circuits; and
a read circuit connected with the third common line,
wherein a first read switch circuit connected with the first bit line of the selected bit line pair in the plurality of read switch circuits is configured to be enabled before the selected bit line pair is activated while reading data from the resistive memory element.

18. The semiconductor memory of claim 11, wherein the plurality of resistive memory elements are configured to utilize a tunneling magnetoresistive effect.

19. The semiconductor memory of claim 13, wherein the write power supply circuit comprises a constant-voltage source.

20. The semiconductor memory of claim 13, wherein the write power supply circuit comprises a constant-current source.

* * * * *